(12) United States Patent
Nakaki et al.

(10) Patent No.: US 12,432,937 B2
(45) Date of Patent: Sep. 30, 2025

(54) SEMICONDUCTOR MEMORY DEVICE WITH PLURALITY OF ARRAYS

(71) Applicant: Kioxia Corporation, Tokyo (JP)

(72) Inventors: Hiroshi Nakaki, Yokkaichi Mie (JP); Keisuke Nakatsuka, Kobe Hyogo (JP)

(73) Assignee: Kioxia Corporation, Tokyo (JP)

( * ) Notice: Subject to any disclaimer, the term of this patent is extended or adjusted under 35 U.S.C. 154(b) by 141 days.

(21) Appl. No.: 18/179,976

(22) Filed: Mar. 7, 2023

(65) Prior Publication Data

US 2023/0397446 A1 Dec. 7, 2023

(30) Foreign Application Priority Data

Jun. 3, 2022 (JP) .................................. 2022-090970

(51) Int. Cl.
*H10B 80/00* (2023.01)
*G11C 16/04* (2006.01)
*G11C 16/08* (2006.01)
*G11C 16/26* (2006.01)

(52) U.S. Cl.
CPC ......... *H10B 80/00* (2023.02); *G11C 16/0483* (2013.01); *G11C 16/08* (2013.01); *G11C 16/26* (2013.01)

(58) Field of Classification Search
CPC ........ H10B 80/00; H10B 43/27; H10B 43/50; G11C 16/0483; G11C 16/08; G11C 16/26; G11C 5/025
See application file for complete search history.

(56) References Cited

U.S. PATENT DOCUMENTS

| | | | |
|---|---|---|---|
| 5,894,447 A * | 4/1999 | Takashima | G11C 7/14 365/158 |
| 10,651,153 B2 | 5/2020 | Fastow et al. | |
| 10,741,527 B2 | 8/2020 | Tagami et al. | |
| 2018/0068732 A1 | 3/2018 | Maeda | |
| 2019/0088331 A1 | 3/2019 | Kobayashi et al. | |
| 2019/0088676 A1 | 3/2019 | Tagami et al. | |
| 2020/0203329 A1 | 6/2020 | Kanamori et al. | |
| 2020/0294958 A1 | 9/2020 | Shibata | |
| 2020/0294971 A1 | 9/2020 | Tanaka et al. | |
| 2023/0019022 A1 * | 1/2023 | D'alessandro | G11C 7/227 |
| 2023/0067423 A1 * | 3/2023 | Lee | H10N 50/01 |

* cited by examiner

*Primary Examiner* — Sultana Begum
(74) *Attorney, Agent, or Firm* — Holtz, Holtz & Volek PC

(57) ABSTRACT

According to an embodiment, a semiconductor memory device includes a first memory cell array, a second memory cell array, and a row decoder. The first memory cell array includes a first select transistor, a first memory cell, a second select transistor, a first word line, a first select gate line, and a second select gate line. The second memory cell array includes, a third select transistor, a second memory cell, a fourth select transistor, a second word line, a third select gate line, a fourth select gate line. The first word line and the second word line are commonly coupled to the row decoder. The first select gate line, the second select gate line, the third select gate line, and the fourth select gate line are separately coupled to the row decoder.

11 Claims, 22 Drawing Sheets

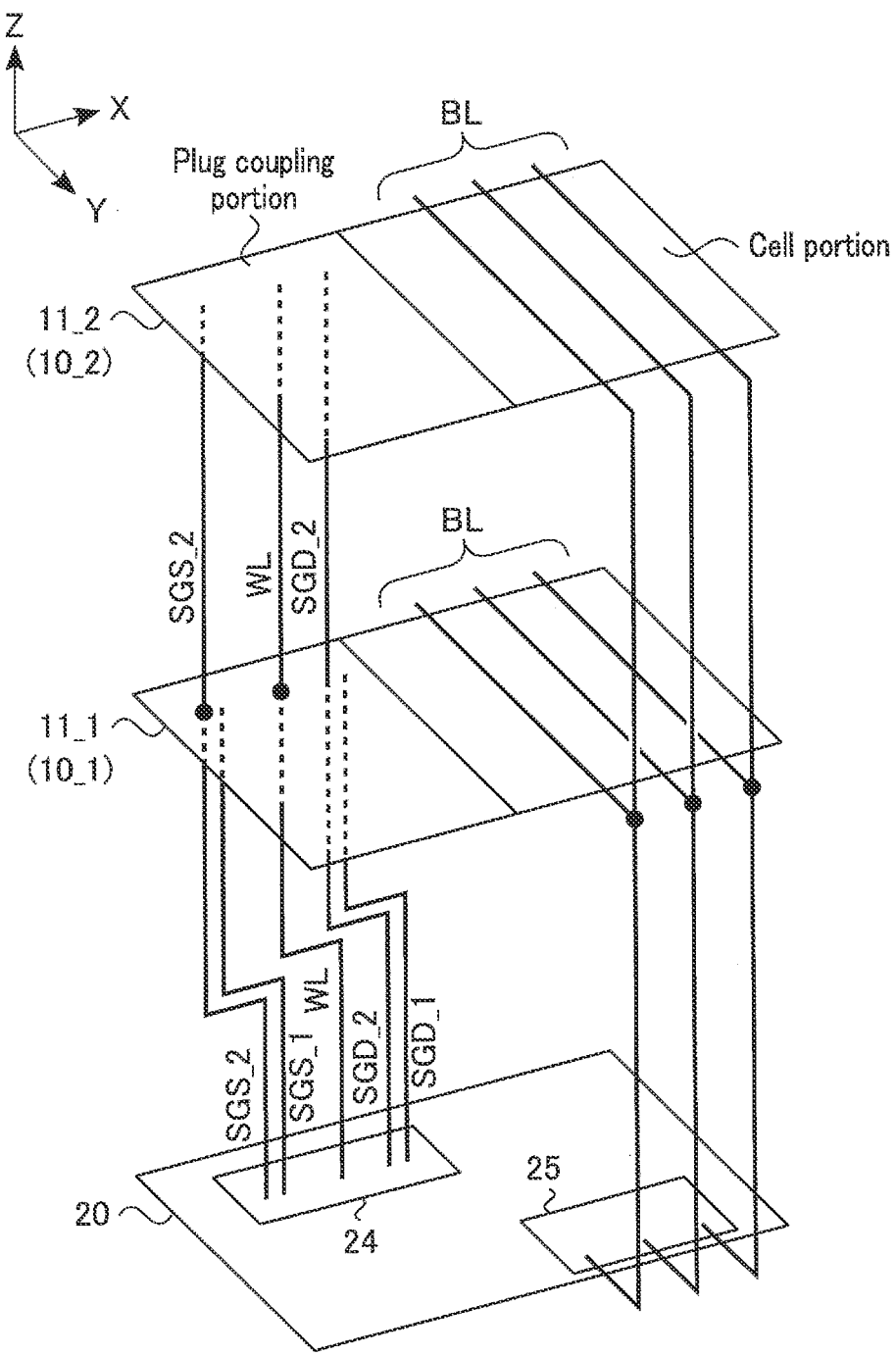
F I G. 3

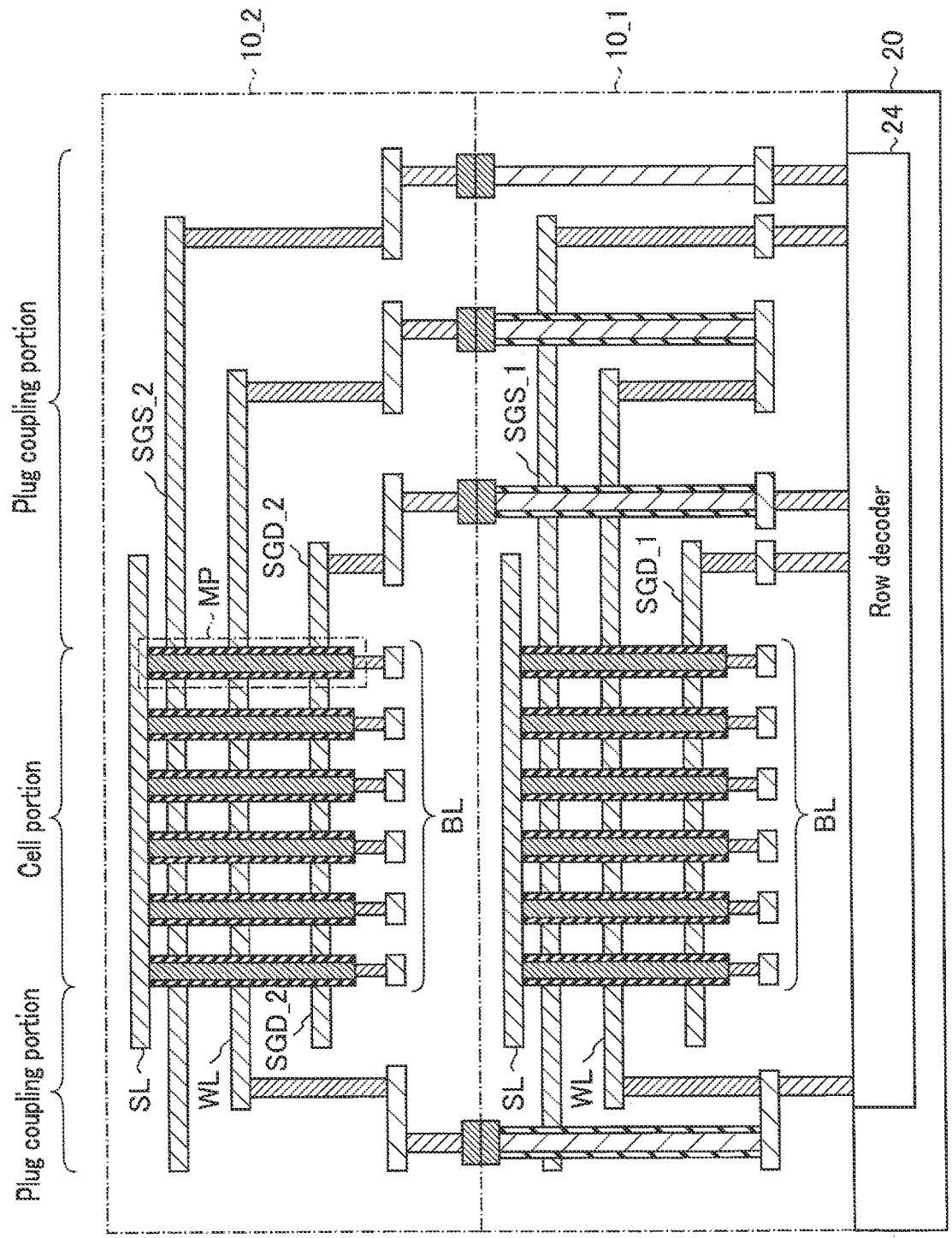
F I G. 16

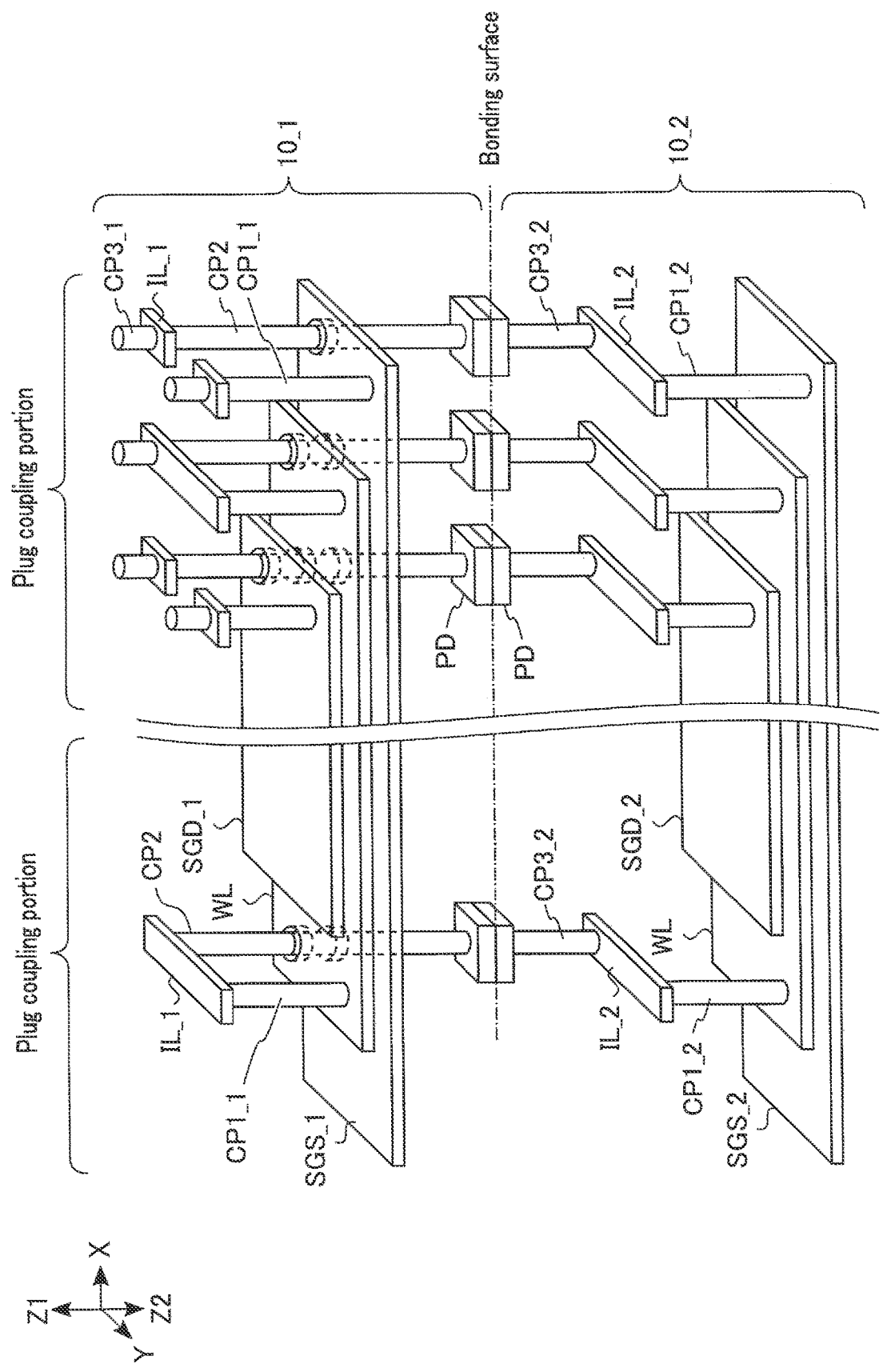
F I G. 17

SEMICONDUCTOR MEMORY DEVICE WITH PLURALITY OF ARRAYS

CROSS-REFERENCE TO RELATED APPLICATIONS

This application is based upon and claims the benefit of priority from Japanese Patent Application No. 2022-090970, filed Jun. 3, 2022, the entire contents of which are incorporated herein by reference.

FIELD

Embodiments described herein relate generally to a semiconductor memory device.

BACKGROUND

As a semiconductor memory device, a NAND flash memory is known.

BRIEF DESCRIPTION OF THE DRAWINGS

FIG. 3 is a conceptual view showing the arrangement of the memory cell arrays 11_1 and 11_2 and a circuit chip 20 included in the semiconductor memory device according to the first embodiment.

FIG. 16 is a sectional view showing the arrangement of the memory cell arrays 11_1 and 11_2 and a circuit chip 20 included in the semiconductor memory device according to the second embodiment.

FIG. 17 is a perspective view showing the configuration of the plug coupling portions of array chips 10_1 and 10_2 included in the semiconductor memory device according to the second embodiment.

DETAILED DESCRIPTION

Figure 1:
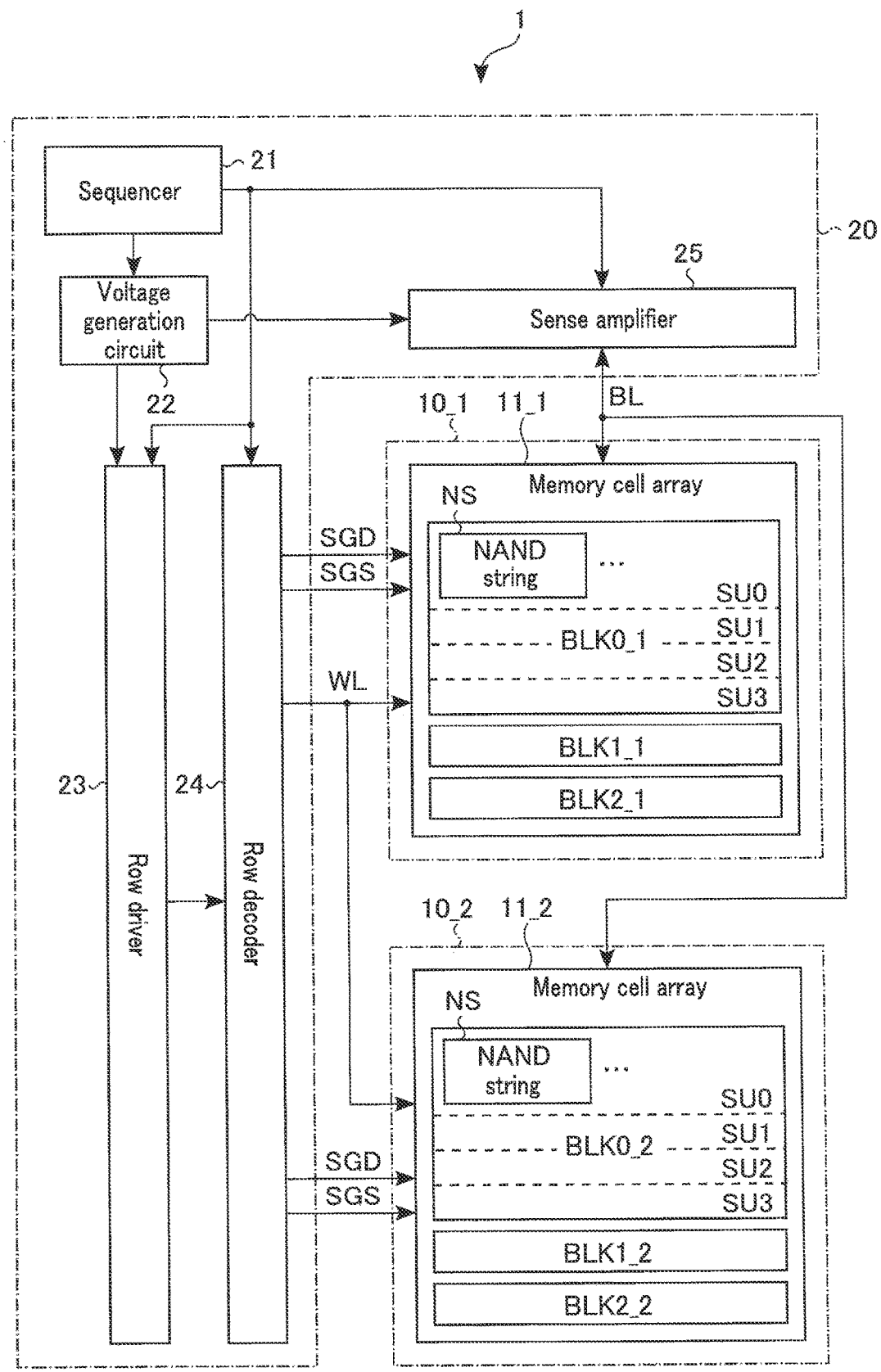
FIG. 1 is a block diagram showing a semiconductor memory device according to the first embodiment.

In general, according to one embodiment, a semiconductor memory device includes a first memory cell array, a second memory cell array arranged above the first memory cell array in a first direction, and a row decoder. The first memory cell array includes a first select transistor, a first memory cell, a second select transistor, a first word line extending in a second direction crossing the first direction and coupled to the first memory cell, a first select gate line extending in the second direction and coupled to the first select transistor, and a second select gate line extending in the second direction and coupled to the second select transistor. The first select transistor, the first memory cell, and the second select transistor are arranged along the first direction and coupled in series. The second memory cell array includes, a third select transistor, a second memory cell, a fourth select transistor, a second word line extending in the second direction and coupled to the second memory cell, a third select gate line extending in the second direction and coupled to the third select transistor, a fourth select gate line extending in the second direction and coupled to the fourth select transistor. The third select transistor, the second memory cell, and the fourth select transistor are arranged along the first direction and coupled in series. The first word line and the second word line are commonly coupled to the row decoder. The first select gate line, the second select gate line, the third select gate line, and the fourth select gate line are separately coupled to the row decoder.

The embodiments will now be described with reference to the accompanying drawings. Note that in the following description, the same reference numerals denote constituent elements having the same functions and configurations. A repetitive description will sometimes be omitted if unnecessary. The embodiments to be described below exemplify devices and methods for embodying the technical concepts of the embodiments. The technical concepts of the embodiments do not limit the materials, shapes, structures, arrangements, and the like of the components to those to be described below. As for the technical concepts of the embodiments, various changes and modifications can be made without departing from the scope of the present invention. The embodiments and their modifications are incorporated in the present invention described in the appended claims and their equivalents.

1. First Embodiment

A semiconductor memory device according to the first embodiment will be described.

1.1 Overall Configuration of Semiconductor Memory Device

An example of the overall configuration of a semiconductor memory device 1 will be described first. FIG. 1 is an example of a block diagram showing the overall configuration of the semiconductor memory device 1. Note that in FIG. 1, some of the couplings between blocks are indicated by arrow lines. However, the couplings between the blocks are not limited to these.

The semiconductor memory device 1 is, for example, a three-dimensional stacked NAND flash memory. The three-dimensional stacked NAND flash memory includes a plurality of nonvolatile memory cell transistors three-dimensionally arranged above semiconductor substrate.

As shown in FIG. 1, the semiconductor memory device 1 includes a plurality of array chips 10 and a circuit chip 20. The array chip 10 is a chip provided with an array of nonvolatile memory cell transistors. The circuit chip 20 is a chip provided with circuits that control the array chip 10. The semiconductor memory device 1 according to this embodiment is formed by bonding the plurality of array chips 10 and the circuit chip 20. If none of the array chips 10 and the circuit chip 20 are limited, these will simply be referred to as "chips" hereinafter.

In the example shown in FIG. 1, the semiconductor memory device 1 includes two array chips 10_1 and 10_2. Note that the number of array chips 10 may be three or more.

Each array chip 10 includes a memory cell array 11. The memory cell array 11 is a region where the nonvolatile memory cell transistors are three-dimensionally arrayed. When limiting the memory cell array 11 of the array chip 10_1, it will be expressed as a memory cell array 11_1. When limiting the memory cell array 11 of the array chip 10_2, it will be expressed as a memory cell array 11_2.

Each memory cell array 11 includes a plurality of blocks BLK. The block BLK is, for example, a set of a plurality of memory cell transistors whose data are erased at once. The plurality of memory cell transistors in the block BLK are associated with rows and columns. In the example shown in FIG. 1, the memory cell array 11 includes blocks BLK0, BLK1, and BLK2. When limiting the blocks BLK in the memory cell array 11_1, these will be referred to as blocks BLK0_1, BLK1_1, and BLK2_1 hereinafter. When limiting the blocks BLK in the memory cell array 11_2, these will be referred to as blocks BLK0_2, BLK1_2, and BLK2_2. When limiting one block BLK in the memory cell array 11_1, it will be referred to as a block BLK_1. When limiting one block BLK in the memory cell array 11_2, it will be referred to as a block BLK_2.

Each block BLK includes a plurality of string units SU. The string unit SU is, for example, a set of a plurality of NAND strings NS selected at once in a write operation or a read operation. In the example shown in FIG. 1, the block BLK includes four string units SU0, SU1, SU2, and SU3.

Each string unit SU includes a plurality of NAND strings NS. Each NAND string NS includes a plurality of memory cell transistors coupled in series.

Note that the number of blocks BLK in the memory cell array 11 and the number of string units SU in the block BLK are arbitrary. The circuit configuration of the memory cell array 11 will be described later.

The circuit chip 20 will be described next. The circuit chip 20 includes a sequencer 21, a voltage generation circuit 22, a row driver 23, a row decoder 24, and a sense amplifier 25.

The sequencer 21 is a circuit that controls the semiconductor memory device 1. The sequencer 21 is coupled to the voltage generation circuit 22, the row driver 23, the row decoder 24, and the sense amplifier 25. The sequencer 21 controls the voltage generation circuit 22, the row driver 23, the row decoder 24, and the sense amplifier 25. Also, the sequencer 21 controls the operation of the entire semiconductor memory device 1 based on the control of an external controller. More specifically, the sequencer 21 executes a write operation, a read operation, an erase operation, and the like.

The voltage generation circuit 22 is a circuit that generates voltages used in the write operation, the read operation, the erase operation, and the like. The voltage generation circuit 22 is coupled to the row driver 23, the sense amplifier 25, and the like. The voltage generation circuit 22 supplies generated voltages to the row driver 23, the sense amplifier 25, and the like.

The row driver 23 is a driver that supplies voltages to the row decoder 24. The row driver 23 is coupled to the row decoder 24. The row driver 23 supplies, to the row decoder 24, voltages applied from the voltage generation circuit 22 based on, for example, a row address (a page address or the like). The row address is an address signal that designates an interconnect in the row direction of the memory cell array 11. A page address is an address signal that designates a page to be described later. The address signal is supplied from the external controller.

The row decoder 24 is a circuit that decodes a row address. The row decoder 24 selects one of the blocks BLK in the memory cell array 11 based on the decoding result of the row address (a block address or the like). The block address is an address signal that designates the block BLK.

More specifically, the row decoder 24 is coupled to the memory cell arrays 11 via a plurality of word lines WL and a plurality of select gate lines SGD and SGS. The word lines WL are interconnects used to control the memory cell transistors. The select gate lines SGD and SGS are interconnects used to select the string units SU. The row decoder 24 applies the voltages supplied from the row driver 23 to the word lines WL and the select gate lines SGD and SGS corresponding to the selected block BLK.

In this embodiment, the word lines WL of the memory cell array 11_1 and the word lines WL of the memory cell array 11_2 are commonly coupled to the row decoder 24. In addition, the select gate lines SGD of the memory cell array 11_1 and the select gate lines SGD of the memory cell array 11_2 are independently coupled to the row decoder 24. Similarly, the select gate lines SGS of the memory cell array 11_1 and the select gate lines SGS of the memory cell array 11_2 are independently coupled to the row decoder 24. That is, the select gate lines SGD of the memory cell array 11_1 and the select gate lines SGD of the memory cell array 11_2 are not electrically coupled. Similarly, the select gate lines SGS of the memory cell array 11_1 and the select gate lines SGS of the memory cell array 11_2 are not electrically coupled. In other words, the memory cell array 11_1 and the memory cell array 11_2 share the word lines WL. The memory cell array 11_1 and the memory cell array 11_2 do not share the select gate lines SGD and SGS.

The sense amplifier 25 is a circuit that performs data write and read. In the read operation, the sense amplifier 25 senses data read out from one string unit SU of one block BLK. Also, in the write operation, the sense amplifier 25 supplies voltages according to write data to the memory cell array 11.

The sense amplifier 25 is coupled to the memory cell array 11 via a plurality of bit lines BL. The bit lines BL are commonly coupled to one NAND string NS of each string unit SU in the memory cell array 11. In this embodiment, the bit lines BL of the memory cell arrays 11_1 and 11_2 are commonly coupled to the sense amplifier That is, the memory cell array 11_1 and the memory cell array 11_2 share the bit lines BL.

1.2 Circuit Configuration of Memory Cell Array

Figure 2:
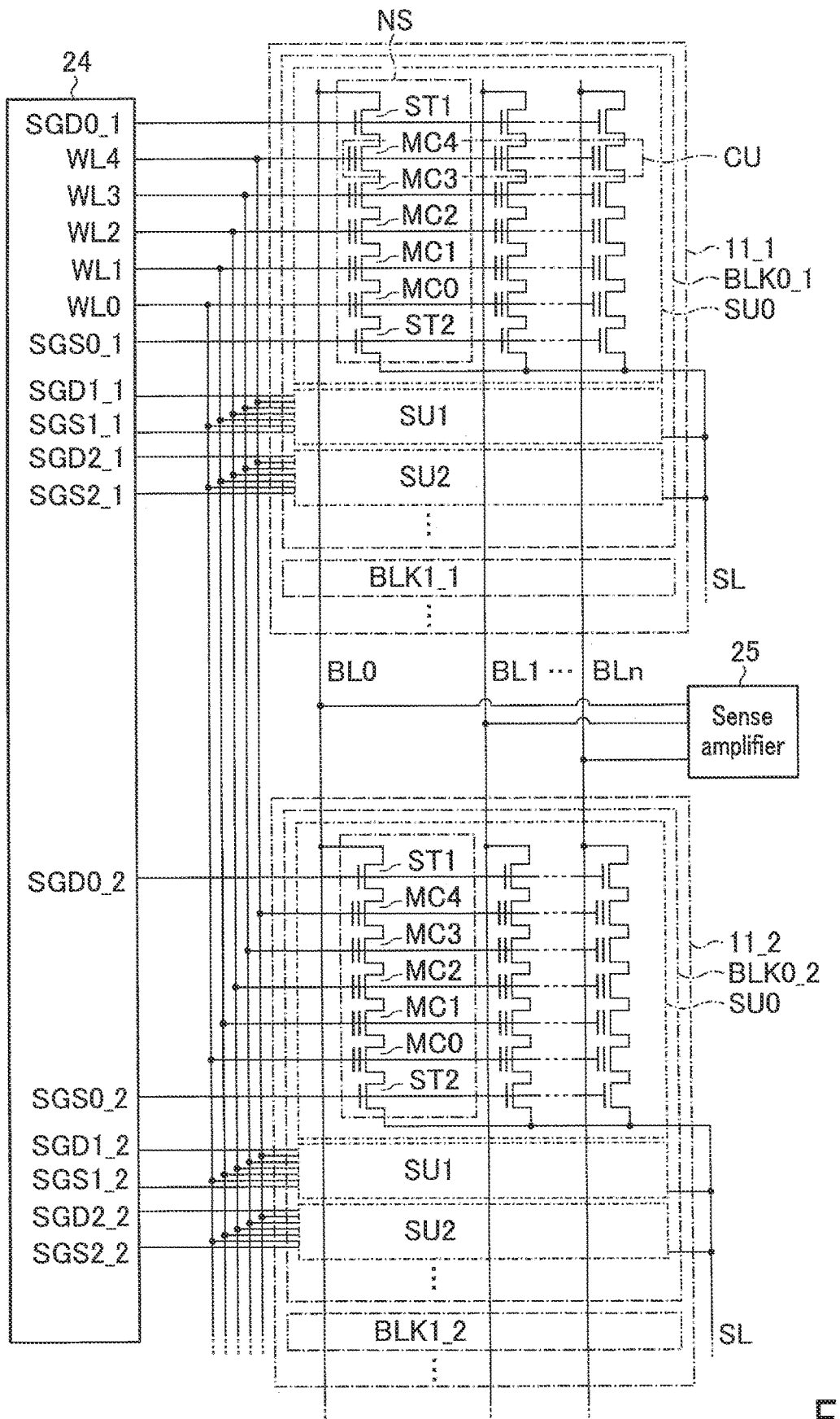
FIG. 2 is a circuit diagram of memory cell arrays 11_1 and 11_2 included in the semiconductor memory device according to the first embodiment.

An example of the circuit configuration of the memory cell arrays 11_1 and 11_2 will be described next with reference to FIG. 2. FIG. 2 is a circuit diagram of the memory cell arrays 11_1 and 11_2.

As shown in FIG. 2, each string unit SU of the memory cell arrays 11_1 and 11_2 includes the plurality of NAND strings NS.

Each NAND string NS includes a plurality of memory cell transistors MC and select transistors ST1 and ST2. In the example shown in FIG. 2, each NAND string NS includes five memory cell transistors MC0 to MC4. Note that the number of memory cell transistors MC is arbitrary.

The memory cell transistor MC nonvolatilely stores data. The memory cell transistor MC includes a control gate and a charge storage layer. The memory cell transistor MC may be of a MONOS (Metal-Oxide-Nitride-Oxide-Silicon) type or an FG (Floating Gate) type. In the MONOS type, an insulator is used in the charge storage layer. In the FG type, a conductor is used in the charge storage layer. A case where the memory cell transistor MC is of the MONOS type will be described below.

The select transistors ST1 and ST2 are used to select the string unit SU in various kinds of operations. The number of select transistors ST1 and ST2 is arbitrary. The select transistors ST1 and ST2 are preferably included in the NAND string NS at least one each.

The current paths of the memory cell transistors MC and the select transistors ST1 and ST2 in each NAND string NS are coupled in series. In the example shown in FIG. 2, the current paths are coupled in series in the order of the select transistor ST2, the memory cell transistors MC0, MC1, MC2, MC3, and MC4, and the select transistor ST1 sequentially from the lower side of the drawing sheet of FIG. 2 to the upper side. The drain of the select transistor ST1 is coupled to one bit line BL. The source of the select transistor ST2 is coupled to a source line SL.

The drains of the plurality of select transistors ST1 in the string unit SU are coupled to different bit lines BL. In the example shown in FIG. 2, the drains of (n+1) (n is an integer of 0 or more) select transistors ST1 in the string unit SU are coupled to (n+1) bit lines BL0 to BLn, respectively. The drain of one select transistor ST1 in each string unit SU of the memory cell arrays 11_1 and 11_2 is commonly coupled to one bit line BL. That is, the memory cell arrays 11_1 and 11_2 share the bit line BL.

The control gates of the plurality of memory cell transistors MC0 to MC4 included in one block BLK_1 of the memory cell array 11_1 and one block BLK_2 of the memory cell array 11_2 are commonly coupled to word lines WL0 to WL4. More specifically, the block BLK0_1 of the memory cell array 11_1 includes a plurality of memory cell transistors MC0. Similarly, the block BLK0_2 of the memory cell array 11_2 includes a plurality of memory cell transistors MC0. The control gates of the plurality of memory cell transistors MC0 in the blocks BLK0_1 and BLK0_2 are commonly coupled to one word line WL0. The memory cell transistors MC1 to MC4 are also similarly coupled to the word lines WL1 to WL4, respectively. That is, the blocks BLK0_1 and BLK0_2 share the word lines WL.

The gates of the plurality of select transistors ST1 in the string unit SU are commonly coupled to one select gate line SGD. More specifically, the string unit SU0 in the block BLK0_1 of the memory cell array 11_1 includes a plurality of select transistors ST1. The gates of the plurality of select transistors ST1 in the string unit SU0 are commonly coupled to a select gate line SGD0_1. Similarly, the gates of the plurality of select transistors ST1 in the string unit SU1 are commonly coupled to a select gate line SGD1_1. The gates of the plurality of select transistors ST1 in the string unit SU2 are commonly coupled to a select gate line SGD2_1. This also applies to the remaining blocks BLK_1. When limiting one select gate line SGD of the memory cell array 11_1, it will be referred to as a select gate line SGD_1 hereinafter.

The string unit SU0 in the block BLK0_2 of the memory cell array 11_2 includes a plurality of select transistors ST1. The gates of the plurality of select transistors ST1 in the string unit SU0 are commonly coupled to a select gate line SGD0_2. Similarly, the gates of the plurality of select transistors ST1 in the string unit SU1 are commonly coupled to a select gate line SGD1_2. The gates of the plurality of select transistors ST1 in the string unit SU2 are commonly coupled to a select gate line SGD2_2. This also applies to the remaining blocks BLK_2. When limiting one select gate line SGD of the memory cell array 11_2, it will be referred to as a select gate line SGD_2 hereinafter.

The gates of the plurality of select transistors ST2 in the string unit SU are commonly coupled to one select gate line SGS. More specifically, the string unit SU0 in the block BLK0_1 of the memory cell array 11_1 includes a plurality of select transistors ST2. The gates of the plurality of select transistors ST2 in the string unit SU0 are commonly coupled to a select gate line SGS0_1. Similarly, the gates of the plurality of select transistors ST2 in the string unit SU1 are commonly coupled to a select gate line SGS1_1. The gates of the plurality of select transistors ST2 in the string unit SU2 are commonly coupled to a select gate line SGS2_1. This also applies to the remaining blocks BLK_1. When limiting one select gate line SGS of the memory cell array 11_1, it will be referred to as a select gate line SGS_1 hereinafter.

The string unit SU0 in the block BLK0_2 of the memory cell array 11_2 includes a plurality of select transistors ST2. The gates of the plurality of select transistors ST2 in the string unit SU0 are commonly coupled to a select gate line SGS0_2. Similarly, the gates of the plurality of select transistors ST2 in the string unit SU1 are commonly coupled to a select gate line SGS1_2. The gates of the plurality of select transistors ST2 in the string unit SU2 are commonly coupled to a select gate line SGD2_2. This also applies to the remaining blocks BLK_2. When limiting one select gate line SGS of the memory cell array 11_2, it will be referred to as a select gate line SGS_2 hereinafter.

The word lines WL0 to WL4, the select gate lines SGD0_1 to SGD2_1 and SGD0_2 to SGD2_2, and the select gate lines SGS0_1 to SGS2_1 and SGS0_2 to SGS2_2 are coupled to the row decoder 24.

The bit lines BL are coupled to the sense amplifier 25.

The source line SL is shared by, for example, the plurality of blocks BLK of the memory cell arrays 11_1 and 11_2.

A set of the plurality of memory cell transistors MC coupled to one word line WL in one string unit SU will be referred to as a "cell unit CU" hereinafter. For example, if the memory cell transistor MC stores 1-bit data, the storage capacity of the cell unit CU is defined as "1 page data". Based on the number of bits of data stored in the memory cell transistor MC, the cell unit CU can have a storage capacity of 2 page data or more.

1.3 Coupling of Various Kinds of Interconnects Between Chips

Figure 4:
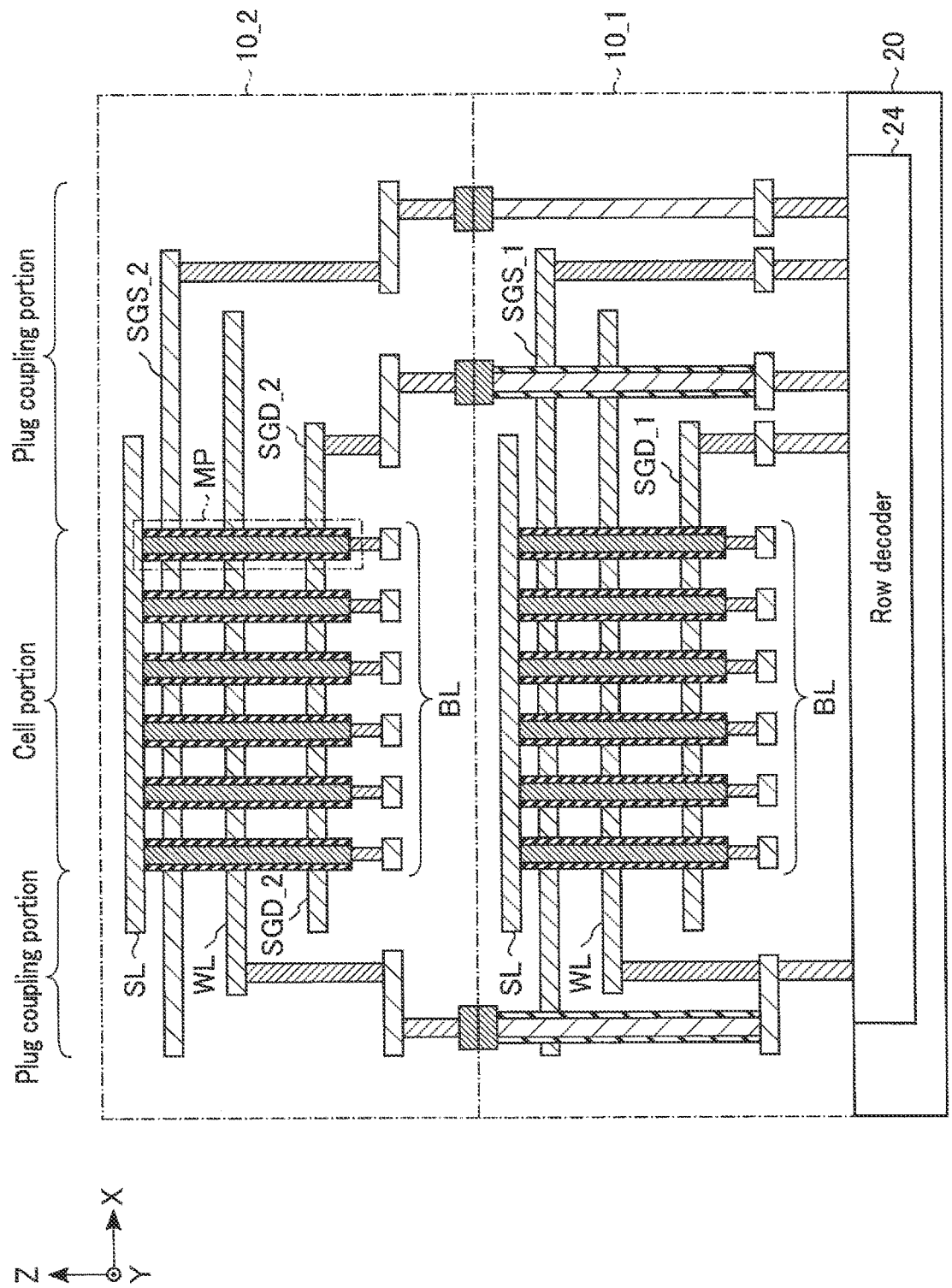
FIG. 4 is a sectional view showing the arrangement of the memory cell arrays 11_1 and 11_2 and the circuit chip 20 included in the semiconductor memory device according to the first embodiment.

An example of coupling of various kinds of interconnects between the chips will be described next with reference to FIGS. 3 and 4. FIG. 3 is a conceptual view showing the arrangement of the memory cell arrays 11_1 and 11_2 and the circuit chip 20. FIG. 4 is a sectional view showing the arrangement of the memory cell arrays 11_1 and 11_2 and the circuit chip 20. FIG. 4 shows one word line WL in one memory cell array 11 to simplify the explanation. In the following description, the X direction corresponds to the extending direction of the word line WL. The Y direction crosses the X direction. The Y direction corresponds to the extending direction of the bit line BL. The Z direction corresponds to a direction crossing the X direction and the Y direction. That is, the Z direction corresponds to the stacking direction of the chips.

As shown in FIGS. 3 and 4, the memory cell array 11_1 is arranged on the circuit chip 20. Then, the memory cell array 11_2 is arranged on the memory cell array 11_1. In other words, the array chips 10_1 and 10_2 are stacked on the circuit chip 20.

The memory cell arrays 11_1 and 11_2 each include a cell portion and a plug coupling portion. The cell portion is a region where the memory cell transistors MC are arranged. More specifically, as shown in FIG. 4, a plurality of memory pillars MP are provided in the cell portion. One memory pillar MP corresponds to one NAND string NS. The configuration of the memory pillar MP will be described later. The memory cell transistor MC is provided at each position where the word line WL and the memory pillar MP cross. The select transistor ST1 is provided at each position where the select gate line SGD and the memory pillar MP cross. The select transistor ST2 is provided at each position where the select gate line SGS and the memory pillar MP cross. One end of the memory pillar MP is commonly coupled to the source line SL. The other end of the memory pillar MP is coupled to the bit line BL.

The bit lines BL arranged in the cell portions of the memory cell arrays 11_1 and 11_2 are commonly coupled to the sense amplifier 25 of the circuit chip 20.

The plug coupling portion is a region where a plurality of contact plugs respectively coupled to one of the word lines WL and the select gate lines SGD and SGS are provided.

The word lines WL of the memory cell arrays 11_1 and 11_2 are commonly coupled to the row decoder 24 of the circuit chip 20.

The select gate line SGD_1 of the memory cell array 11_1 is coupled to the row decoder 24 of the circuit chip 20. The select gate line SGD_2 of the memory cell array 11_2 is coupled to the row decoder 24 of the circuit chip 20. The select gate line SGD_1 of the memory cell array 11_1 and the select gate line SGD_2 of the memory cell array 11_2 are not electrically coupled.

Similarly, the select gate line SGS_1 of the memory cell array 11_1 is coupled to the row decoder 24 of the circuit chip 20. The select gate line SGS_2 of the memory cell array 11_2 is coupled to the row decoder 24 of the circuit chip 20. The select gate line SGS_1 of the memory cell array 11_1 and the select gate line SGS_2 of the memory cell array 11_2 are not electrically coupled.

1.4 Configuration of Plug Coupling Portions

Figure 5:
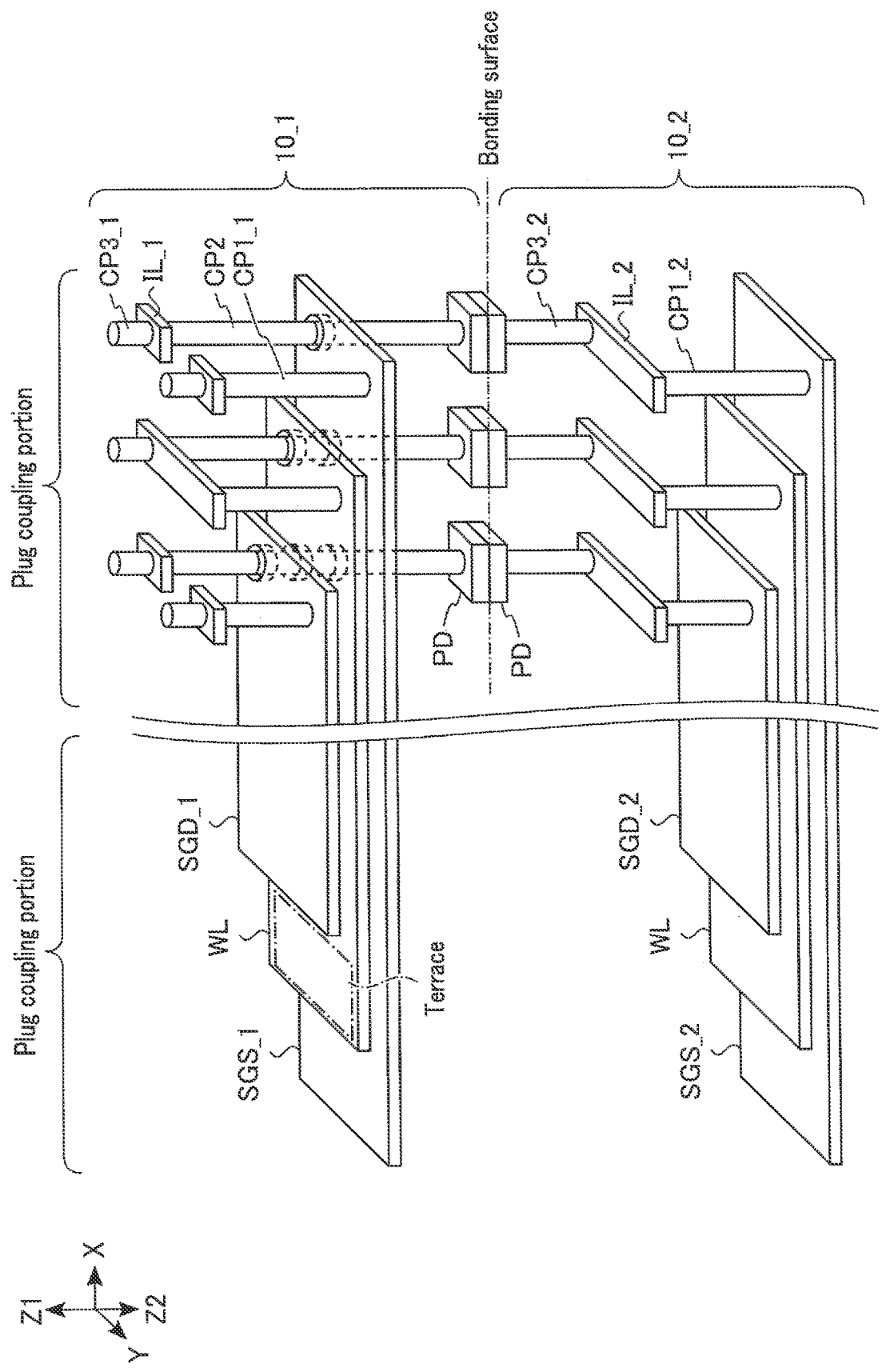
FIG. 5 is a perspective view showing the configuration of the plug coupling portions of array chips 10_1 and 10_2 included in the semiconductor memory device according to the first embodiment.

An example of the configuration of the plug coupling portions will be described next with reference to FIG. 5. FIG. 5 is a perspective view showing the configuration of the plug coupling portions of the array chips 10_1 and 10_2. In FIG. 5, the cell portion is not illustrated to simplify the explanation. Also, FIG. 5 shows one word line WL in one memory cell array 11 to simplify the explanation. In the following description, when limiting the Z direction from the array chip 10 to the circuit chip 20, it will be referred to as a Z1 direction. When limiting the Z direction from the circuit chip 20 to the array chip 10, it will be referred to as a Z2 direction.

As shown in FIG. 5, in each block BLK of the memory cell array 11, the both ends of each of the word lines WL and the select gate lines SGD and SGS extending in the X direction are extracted in a staircase shape in the plug coupling portions. The regions extracted in the staircase shape will be referred to as "terraces" hereinafter.

The array chip 10_2 will be described first. For example, in the plug coupling portion of the memory cell array 11_2 on the right side of the drawing sheet of FIG. 5, a contact plug CP1_2 is provided on each of the terraces of the word line WL, the select gate line SGD_2, and the select gate line SGS_2. The contact plug CP1_2 extends in the Z direction. On each contact plug CP1_2 facing the Z1 direction, an interconnect layer IL_2 is provided. The interconnect layer IL_2 extends in the Y direction. On each interconnect layer IL_2 facing the Z1 direction, a contact plug CP3_2 is provided. The contact plug CP3_2 extends in the Z direction. On each contact plug CP3_2 facing the Z1 direction, an electrode pad PD is provided. The electrode pad PD is used for electrical coupling to another chip. The electrode pad PD is provided on the bonding surface to another chip.

The array chip 10_1 will be described next. On the bonding surface between the array chip 10_1 and the array chip 10_2, the electrode pads PD of the array chip 10_1 are provided at positions facing the electrode pads PD of the array chip 10_2. On each electrode pad PD facing the Z1 direction, a contact plug CP2 is provided. The contact plug CP2 extends in the Z direction. The contact plugs CP2 extend (pass) through the word line WL and the select gate lines SGD_1 and SGS_1 of the memory cell array 11_1. The contact plugs CP2 are not electrically coupled to the word line WL and the select gate lines SGD_1 and SGS_1. For example, in the plug coupling portion of the memory cell array 11_1 on the right side of the drawing sheet of FIG. 5, a contact plug CP1_1 is provided on each of the terraces of the word line WL, the select gate line SGD_1, and the select gate line SGS_1. The contact plug CP1_1 extends in the Z direction. If none of the contact plugs CP1_1 and CP1_2 are limited, these will be referred to as "contact plugs CP1".

On each of the contact plugs CP1_1 and CP2 facing the Z1 direction, an interconnect layer IL_1 is provided. The interconnect layer IL_1 extends in the Y direction. More specifically, the contact plug CP1_1 coupled to the word line WL of the memory cell array 11_1 and the contact plug CP2 electrically coupled to the word line WL of the memory cell array 11_2 are commonly coupled to one interconnect layer IL_1. The contact plug CP1_1 coupled to the select gate line SGD_1 of the memory cell array 11_1 and the contact plug CP2 electrically coupled to the select gate line SGD_2 of the memory cell array 11_2 are coupled to different interconnect layers IL_1. Similarly, the contact plug CP1_1 coupled to the select gate line SGS_1 of the memory cell array 11_1 and the contact plug CP2 electrically coupled to the select gate line SGS_2 of the memory cell array 11_2 are coupled to different interconnect layers IL_1. On each interconnect layer IL_1 facing the Z1 direction, a contact plug CP3_1 is provided. The contact plug CP3_1 extends in the Z direction. If none of the interconnect layers IL_1 and IL_2 are limited, these will be referred to as "interconnect layers IL" hereinafter. In addition, if none of the contact plugs CP3_1 and CP3_2 are limited, these will be referred to as "contact plugs CP3".

1.5 Planar Configurations of Memory Cell Arrays

Figure 6:
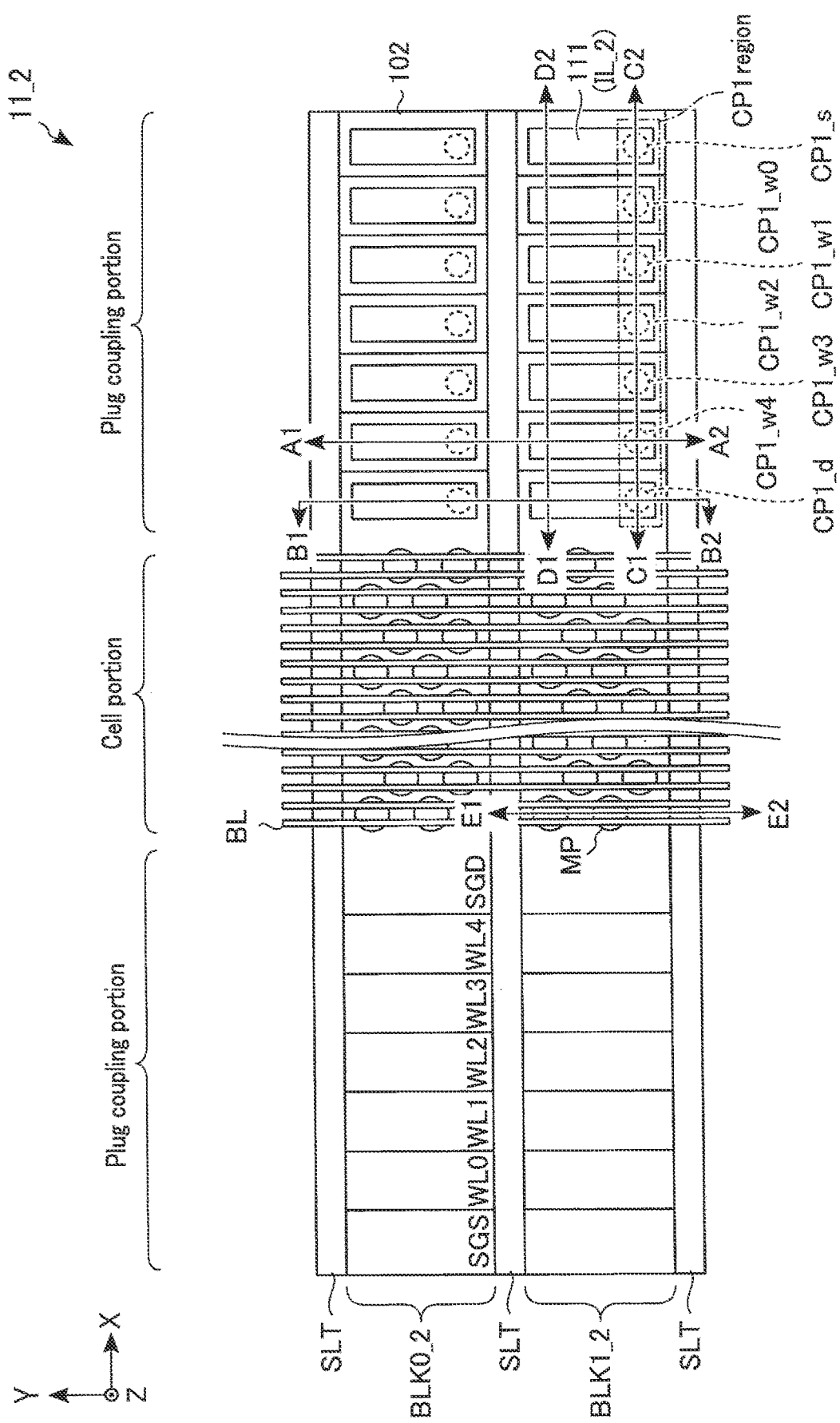
FIG. 6 is a plan view of the memory cell array 11_2 included in the semiconductor memory device according to the first embodiment.
Figure 7:
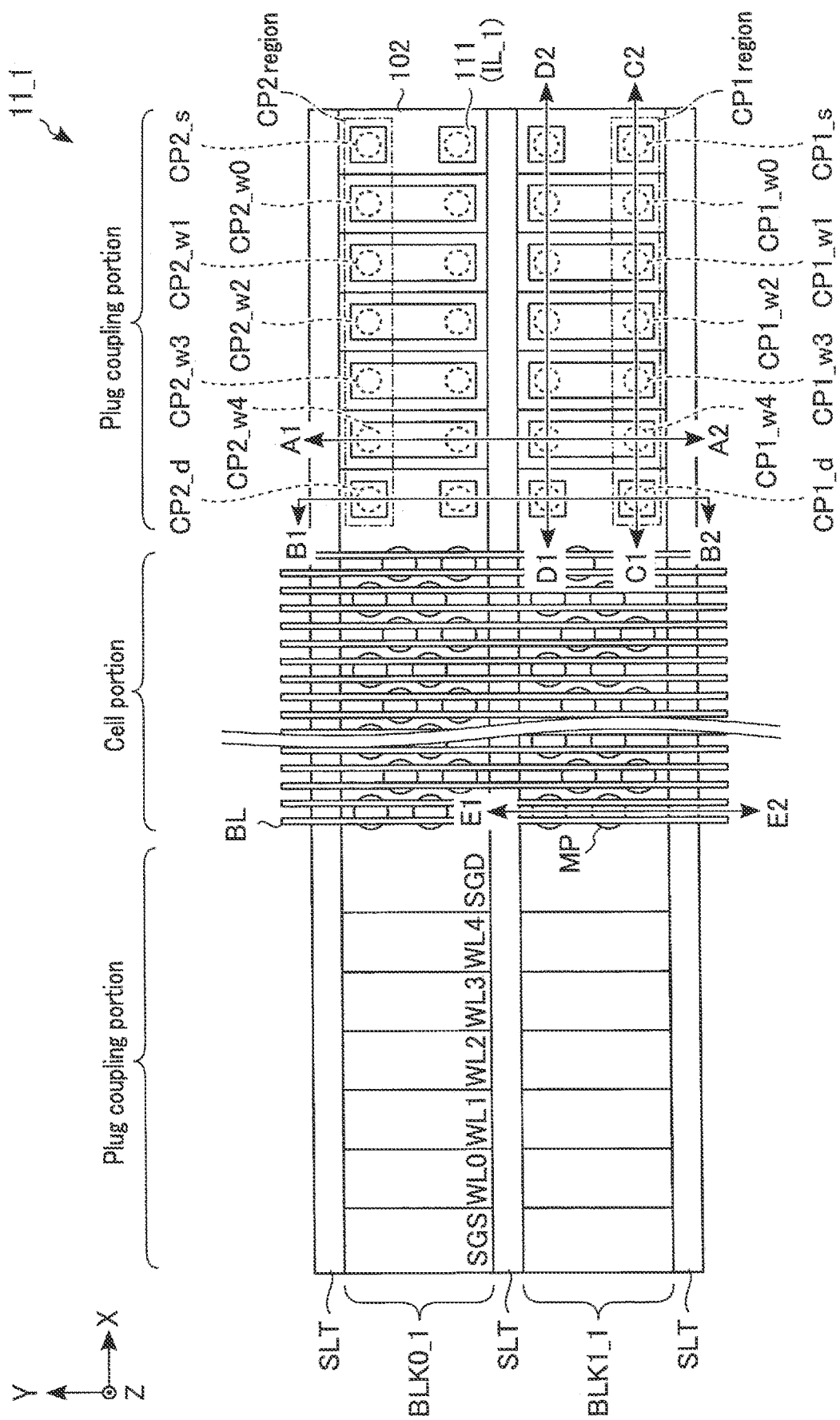
FIG. 7 is a plan view of the memory cell array 11_1 included in the semiconductor memory device according to the first embodiment.

An example of the planar configurations of the memory cell arrays 11 will be described next with reference to FIGS. 6 and 7. FIG. 6 is a plan view of the memory cell array 11_2. FIG. 7 is a plan view of the memory cell array 11_1. Note that in the example shown in FIGS. 6 and 7, to simplify the explanation, a case where each block BLK includes one string unit SU will be described. In the example shown in FIGS. 6 and 7, insulating layers are not illustrated.

The planar configuration of the memory cell array 11_2 will be described first.

As shown in FIG. 6, for example, the blocks BLK0_2 and BLK1_2 are arranged in the Y direction from the upper side of the drawing sheet of FIG. 6 to the lower side. The block BLK includes a cell portion and plug coupling portions. The cell portion is provided at the center of the block BLK. The plug coupling portions are provided at the two end portions of the block BLK.

In each block BLK, a plurality of interconnect layers 102 are stacked apart in the Z direction. For example, seven interconnect layers 102 functioning as the select gate line SGS, the word lines WL0 to WL4, and the select gate line SGD are stacked in this order. For example, the seven interconnect layers 102 are extracted in a staircase shape extending in the X direction in the plug coupling portions. Slits SLT are provided on two side surfaces of each interconnect layer 102 facing the Y direction. The slits SLT extend in the X direction and the Z direction. The slits SLT separate the interconnect layers 102 for each block BLK.

The cell portion is provided with the plurality of memory pillars MP. The memory pillars MP are pillars corresponding to the NAND strings NS. Details of the structure of the memory pillars MP will be described later. The memory pillars MP extend in the Z direction. The memory pillars MP extend (pass) through the plurality of interconnect layers 102 stacked in the Z direction.

In the example shown in FIG. 6, the plurality of memory pillars MP in the block BLK are staggered in the X direction. Note that the array of the memory pillars MP can arbitrarily be designed. The array of the memory pillars MP may be, for example, a staggered arrangement of eight columns. The array of the memory pillars MP may not be the staggered arrangement.

The plurality of bit lines BL are arranged in the X direction above the memory pillars MP. The bit lines BL extend in the Y direction. Each memory pillar MP is electrically coupled to one of the bit lines BL.

The plug coupling portion of the memory cell array 11_2 includes a CP1 region. In the example shown in FIG. 6, the CP1 region is provided in the plug coupling portion on the right side of the drawing sheet of FIG. 6, and the CP1 region is not provided in the plug coupling portion on the left side of the drawing sheet of FIG. 6.

The CP1 region is a region where the plurality of contact plugs CP1 are provided. One end of each contact plug CP1 is coupled to the terrace of one of the interconnect layers 102. The contact plug CP1 is not electrically coupled to other interconnect layers 102. In the example shown in FIG. 6, seven contact plugs CP1 are provided in one CP1 region. One-end sides of the seven contact plugs CP1 are coupled to the terraces of the seven interconnect layers 102, respectively. When limiting the contact plugs CP1 coupled to the word lines WL0, WL1, WL2, WL3, and WL4, these will be referred to as contact plugs CP1_w0, CP1_w1, CP1_w2, CP1_w3, and CP1_w4 hereinafter. When limiting the contact plugs CP1 coupled to the select gate lines SGD and SGS, these will be referred to as contact plugs CP1_d and CP1_s. In the example shown in FIG. 6, the contact plugs CP1_s, CP1_w0, CP1_w1, CP1_w2, CP1_w3, CP1_w4, and CP1_d are arranged in a line from the end portion of the memory cell array 11_2 in the X direction to the cell portion.

A interconnect layer 111 is provided on each contact plug CP1. The interconnect layer 111 of the memory cell array 11_2 functions as the interconnect layer IL_2. The interconnect layer 111 extends in the Y direction.

The planar configuration of the memory cell array 11_1 will be described next. Differences from the planar configuration of the memory cell array 11_2 will mainly be described below.

As shown in FIG. 7, the configuration of the cell portion is the same as in the memory cell array 11_2.

The plug coupling portion of the memory cell array 11_1 includes a CP1 region and a CP2 region. In the example shown in FIG. 7, the CP1 region and the CP2 region are provided in the plug coupling portion on the right side of the drawing sheet of FIG. 7, and the CP1 region and the CP2 region are not provided in the plug coupling portion on the left side of the drawing sheet of FIG. 7.

The configuration of the CP1 region is the same as in the memory cell array 11_2.

The CP2 region is a region where the plurality of contact plugs CP2 are provided. The contact plugs CP2 extend in the Z direction. The contact plugs CP2 extend through the memory cell array 11_1. The contact plugs CP2 are not electrically coupled to the interconnect layers 102 of the memory cell array 11_1. The contact plugs CP2 are electrically coupled to the contact plugs CP1 of the memory cell array 11_2 via the interconnect layers 111 of the array chip 10_2 described with reference to FIG. 6.

In the example shown in FIG. 7, seven contact plugs CP2 are provided in one CP2 region. The seven contact plugs CP2 correspond to the seven contact plugs CP1 of the memory cell array 11_2, respectively. The contact plugs CP2 coupled to the contact plugs CP1_w0, CP1_w1, CP1_w2, CP1_w3, and CP1_w4 of the memory cell array 11_2 will be referred to as contact plugs CP2_w0, CP2_w1, CP2_w2, CP2_w3, and CP2_w4 hereinafter. The contact plugs CP2 coupled to the contact plugs CP1_d and CP1_s of the memory cell array 11_2 will be referred to as contact plugs CP2_d and CP2_s.

The interconnect layers 111 are provided on the contact plugs CP1 and CP2 of the memory cell array 11_1. Each interconnect layer 111 of the memory cell array 11_1 functions as the interconnect layer IL_1. The contact plugs CP1_w0 to CP1_w4 are coupled to the contact plugs CP2_w0 to CP2_w4 via the interconnect layers 111, respectively. Also, different interconnect layers 111 are provided on the contact plug CP1_d and the contact plug CP2_d. That is, the contact plug CP1_d and the contact plug CP2_d are not electrically coupled. Similarly, different interconnect layers 111 are provided on the contact plug CP1_s and the contact plug CP2_s. That is, the contact plug CP1_s and the contact plug CP2_s are not electrically coupled.

That is, the word lines WL0 to WL4 of the block BLK0_1 of the memory cell array 11_1 and the word lines WL0 to WL4 of the block BLK0_2 of the memory cell array 11_2 are electrically coupled, respectively. Also, the select gate line SGD of the block BLK0_1 of the memory cell array 11_1 and the select gate line SGD of the block BLK0_2 of the memory cell array 11_2 are not electrically coupled. The select gate line SGS of the block BLK0_1 of the memory cell array 11_1 and the select gate line SGS of the block BLK0_2 of the memory cell array 11_2 are not electrically coupled. This also applies to the remaining blocks BLK.

1.6 Sectional Configuration of Semiconductor Memory Device

The sectional configuration of the semiconductor memory device 1 will be described next.

1.6.1 Configuration of Section A1-A2

Figure 8:
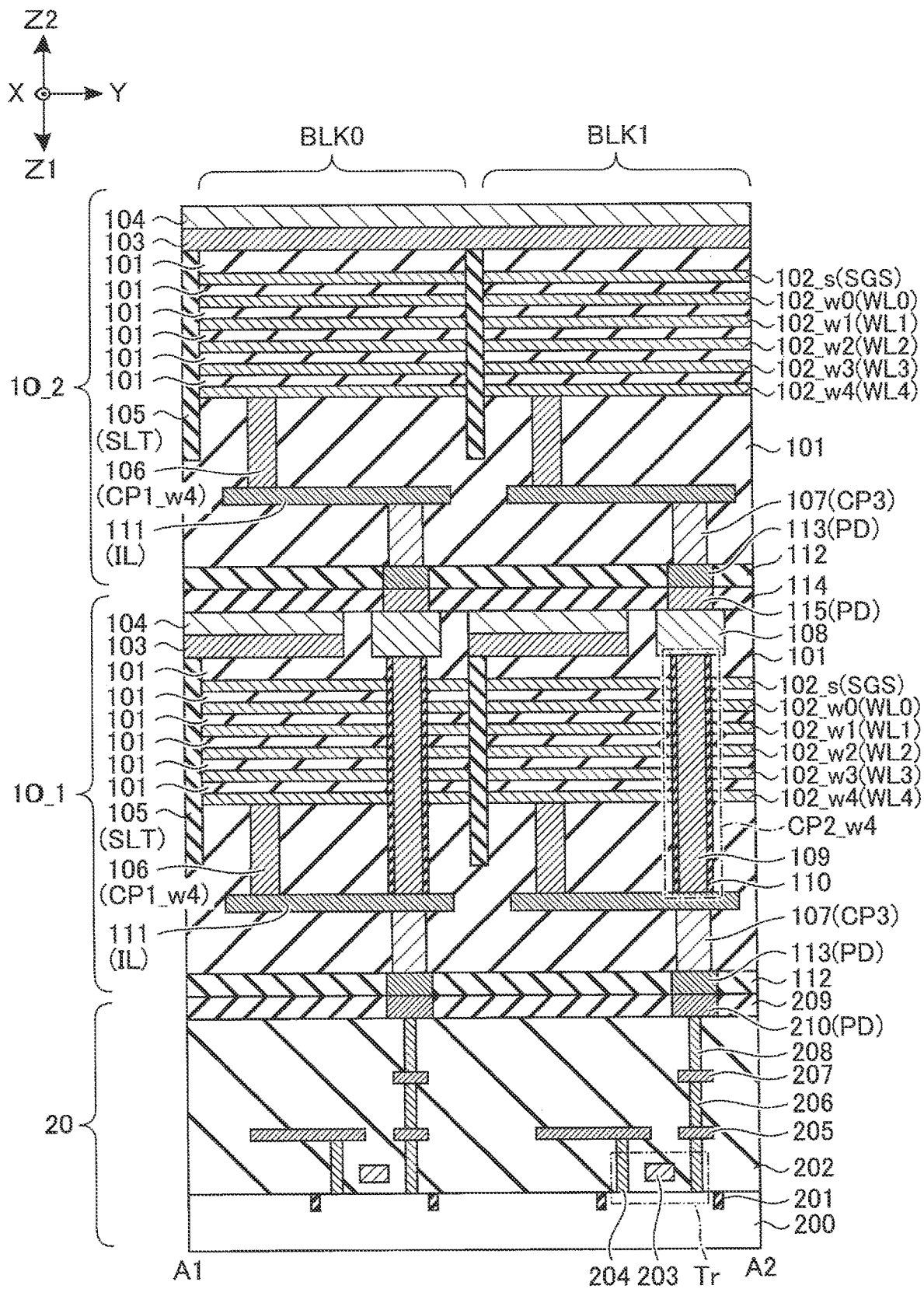
FIG. 8 is a sectional view taken along a line A1-A2 in FIGS. 6 and 7.

An example of the configuration of a section A1-A2 of the semiconductor memory device 1 will be described first with reference to FIG. 8. FIG. 8 is a sectional view taken along a line A1-A2 in FIGS. 6 and 7.

As shown in FIG. 8, the semiconductor memory device 1 has a configuration in which the array chips 10_1 and 10_2 and the circuit chip 20 are bonded. The chips are electrically coupled via the electrode pads PD provided on the chips.

The internal configuration of the array chip 10_1 will be described first.

The array chip 10_1 includes the memory cell array 11_1 and various kinds of interconnect layers. The various kinds of interconnect layers are used to couple the memory cell array 11_1, the array chip 10_2, and the circuit chip 20.

The array chip 10_1 includes insulating layers 101, 105, 110, 112, and 114, the interconnect layers 102, 103, 104, and 111, and conductors 106, 107, 108, 109, 113, and 115.

In the memory cell array 11_1, a plurality of insulating layers 101 and a plurality of interconnect layers 102 are alternately stacked one by one. The example of FIG. 8 shows the section of the terrace of the word line WL4. Hence, six interconnect layers 102 functioning as the select gate line SGS and the word lines WL0 to WL4 are stacked in this order, in the Z1 direction. When limiting the interconnect layers 102 functioning as the word lines WL0, WL1, WL2, WL3, and WL4, these will be referred to as interconnect layers 102_w0, 102_w1, 102_w2, 102_w3, and 102_w4 hereinafter. When limiting the interconnect layers 102 functioning as the select gate lines SGD and SGS, these will be referred to as interconnect layers 102_d and 102_s.

For the insulating layer 101, for example, silicon oxide (SiO) containing silicon and oxygen is used. The interconnect layer 102 contains a conductive material. As the conductive material, for example, a metal material, an n-type semiconductor, or a p-type semiconductor is used. For example, as the conductive material of the interconnect layer 102, a stacked structure of titanium nitride (TiN)/tungsten (W) is used. In this case, TiN is formed to cover W. Note that the interconnect layer 102 may contain a high dielectric constant material such as aluminum oxide (AlO) containing oxygen and aluminum. In this case, the high dielectric constant material is formed to cover the conductive material.

The plurality of interconnect layers 102 are separated for each block BLK by the slits SLT extending in the X direction. The inside of each slit SLT is filled with the insulating layer 105. For the insulating layer 105, for example, SiO is used.

In the Z2 direction, the interconnect layer 103 is provided above the interconnect layer 102_s. The insulating layer 101 is provided between the interconnect layer 102 and the interconnect layer 103. The interconnect layer 103 functions as the source line SL. In the Z2 direction, the interconnect layer 104 is provided on the interconnect layer 103. The interconnect layer 104 is used as an interconnect layer for electrically coupling the interconnect layer 103 and the circuit chip 20. The interconnect layers 103 and 104 contain a conductive material. As the conductive material, for example, a metal material, an n-type semiconductor, or a p-type semiconductor is used.

In the Z1 direction, the contact plug CP1 is provided on each interconnect layer 102. The contact plug CP1 has, for example, a columnar shape. The contact plug CP1 includes the conductor 106. The conductor 106 has, for example, a columnar shape. One end of the conductor 106 is in contact with the interconnect layer 102. As the conductor 106, for example, a metal material containing tungsten (W) and titanium nitride (TiN) is used. In this case, TiN functions as a barrier metal and is formed to cover W. In the example shown in FIG. 8, the contact plug CP1_w4 is provided on the interconnect layer 102 functioning as the word line WL4.

The contact plugs CP2 extending through the plurality of interconnect layers 102 are provided. The contact plug CP2 has, for example, a columnar shape. The contact plug CP2 includes the conductor 109 and the insulating layer 110. The conductor 109 has, for example, a columnar shape. As the conductor 109, for example, a metal material containing tungsten (W) and titanium nitride (TiN) is used. The insulating layer 110 is provided to cover the side surface (outer periphery) of the conductor 109. The insulating layer 110 has, for example, a cylindrical shape. The conductor 109 is not electrically coupled to the interconnect layers 102 because of the insulating layer 110. For the insulating layer 110, for example, SiO is used.

In the CP2 region where the contact plugs CP2 are provided, the interconnect layer 103 and the interconnect layer 104 are not provided. In the Z2 direction, the conductor 108 is provided above the interconnect layer 102. The insulating layer 101 is provided between the interconnect layer 102 and the conductor 108. The conductor 108 is in contact with one end of the contact plug CP2.

In the Z1 direction, the interconnect layer 111 is provided above the interconnect layer 102. The interconnect layer 111 extends in the Y direction. The insulating layer 101 is provided between the interconnect layer 102 and the interconnect layer 111. The interconnect layer 111 contains a conductive material. As the conductive material, for example, a metal material containing Cu or Al is used.

The other end of the contact plug CP1 with one end coupled to the interconnect layer 102 functioning as the word line WL is electrically coupled to the other end of the contact plug CP2 via the interconnect layer 111. The contact plugs CP1 and CP2 coupled to the interconnect layer 111 are arranged along the Y direction. In the example shown in FIG. 8, the contact plug CP1_w4 and the contact plug CP2_w4 are coupled.

In the Z1 direction, the contact plug CP3 is provided on each interconnect layer 111. The contact plug CP3 has, for example, a columnar shape. The contact plug CP3 includes the conductor 107. The conductor 107 has, for example, a columnar shape. One end of the conductor 107 is in contact with the interconnect layer 111. As the conductor 107, for example, a metal material containing Cu (copper) or Al (aluminum) is used.

In the Z1 direction, the insulating layer 112 is provided on the contact plug CP3 and the insulating layer 101. For the insulating layer 112, for example, SiO is used.

A plurality of conductors 113 are provided in the insulating layer 112. The conductors 113 function as the electrode pads PD. For example, one conductor 113 is provided on one contact plug CP3. As the conductor 113, for example, a metal material containing Cu is used.

In the Z2 direction, the insulating layer 114 is provided on the interconnect layer 104, the insulating layer 101, and the conductor 108. For the insulating layer 114, for example, SiO is used.

A plurality of conductors 115 are provided in the insulating layer 114. The conductors 115 function as the electrode pads PD. For example, one conductor 115 is provided on one conductor 108. As the conductor 115, for example, a metal material containing Cu is used.

The internal configuration of the array chip 10_2 will be described next. Differences from the array chip 10_1 will mainly be described below.

In the array chip 10_2, the contact plug CP2, the conductor 108, the insulating layer 114, and the conductor 115 described concerning the configuration of the array chip 10_1 are eliminated. The rest of the configuration is the same as in the array chip 10_1. The conductor 113 of the array chip 10_2 is coupled to the conductor 115 of the array chip 10_1.

For example, the interconnect layer 102 of the array chip 10_2 is electrically coupled to the contact plug CP2 of the array chip 10_1 via the contact plug CP1 (CP1_2) of the array chip 10_2, the interconnect layer 111 (IL_2) of the array chip 10_2, the contact plug CP3 (CP3_2) of the array chip 10_2, the conductor 113 (PD) of the array chip 10_2, the conductor 115 (PD) of the array chip 10_1, and the conductor 108 of the array chip 10_1.

In the example shown in FIG. 8, the interconnect layer 102_w4 of the block BLK0_2 of the array chip 10_2 and the interconnect layer 102_w4 of the block BLK0_2 of the array chip 10_1 are electrically coupled. In other words, the word line WL4 of the memory cell array 11_2 and the word line WL4 of the memory cell array 11_1 arranged above in the Z1 direction are electrically coupled. At this time, the contact plug CP1_w4 of the memory cell array 11_2 and the contact plug CP1_w4 of the memory cell array 11_1 arranged above in the Z1 direction are electrically coupled. This also applies to the remaining word lines WL. Note that the contact plug CP2 and the conductor 108 may be provided in the memory cell array 11_2.

The circuit chip 20 will be described next.

The circuit chip 20 includes a plurality of transistors Tr and various kinds of interconnect layers. The plurality of transistors Tr are used for the sequencer 21, the voltage generation circuit 22, the row driver 23, the row decoder 24, the sense amplifier 25, and the like.

More specifically, the circuit chip 20 includes a semiconductor substrate 200, insulating layers 201, 202, and 209, a gate electrode 203, conductors 204, 206, 208, and 210, and interconnect layers 205 and 207.

An element isolation region is provided near the surface of the semiconductor substrate 200. The element isolation region, for example, electrically isolates an n-type well region and a p-type well region provided near the surface of the semiconductor substrate 200. The inside of the element isolation region is filled with the insulating layer 201. For the insulating layer 201, for example, SiO is used.

The insulating layer 202 is provided on the semiconductor substrate 200. For the insulating layer 202, for example, SiO is used.

The transistor Tr includes a gate insulating film (not shown) provided on the semiconductor substrate 200, the gate electrode 203 provided on the gate insulating film, and a source and a drain (neither are shown) formed in the semiconductor substrate 200. The source and the drain are electrically coupled to the interconnect layers 205 via the conductors 204. The conductors 204 extend in the Z2 direction. The conductor 204 functions as a contact plug. The conductor 206 is provided on the interconnect layer 205. The conductor 206 extends in the Z2 direction. The conductor 206 functions as a contact plug. The interconnect layer 207 is provided on the conductor 206. The conductor 208 is provided on the interconnect layer 207. The conductor 208 extends in the Z2 direction. Note that the number of interconnect layers provided between the semiconductor substrate 200 and the conductor 210 in the circuit chip 20 is arbitrary. The conductor 208 functions as a contact plug. The interconnect layers 205 and 207 are made of a conductive material. For the conductors 204, 206, and conductor 208 and the interconnect layers 205 and 207, for example, a metal material, a p-type semiconductor, or an n-type semiconductor is used.

In the Z2 direction, the insulating layer 209 is provided on the insulating layer 202. For the insulating layer 209, for example, SiO is used.

A plurality of conductors 210 are provided in the insulating layer 209. The conductors 210 function as the electrode pads PD. For example, one conductor 210 is provided on one conductor 208. As the conductor 210, for example, a metal material containing Cu is used. The conductor 210 of the circuit chip 20 is coupled to the conductor 113 of the array chip 10_1.

1.6.2 Configuration of Section B1-B2

Figure 9:
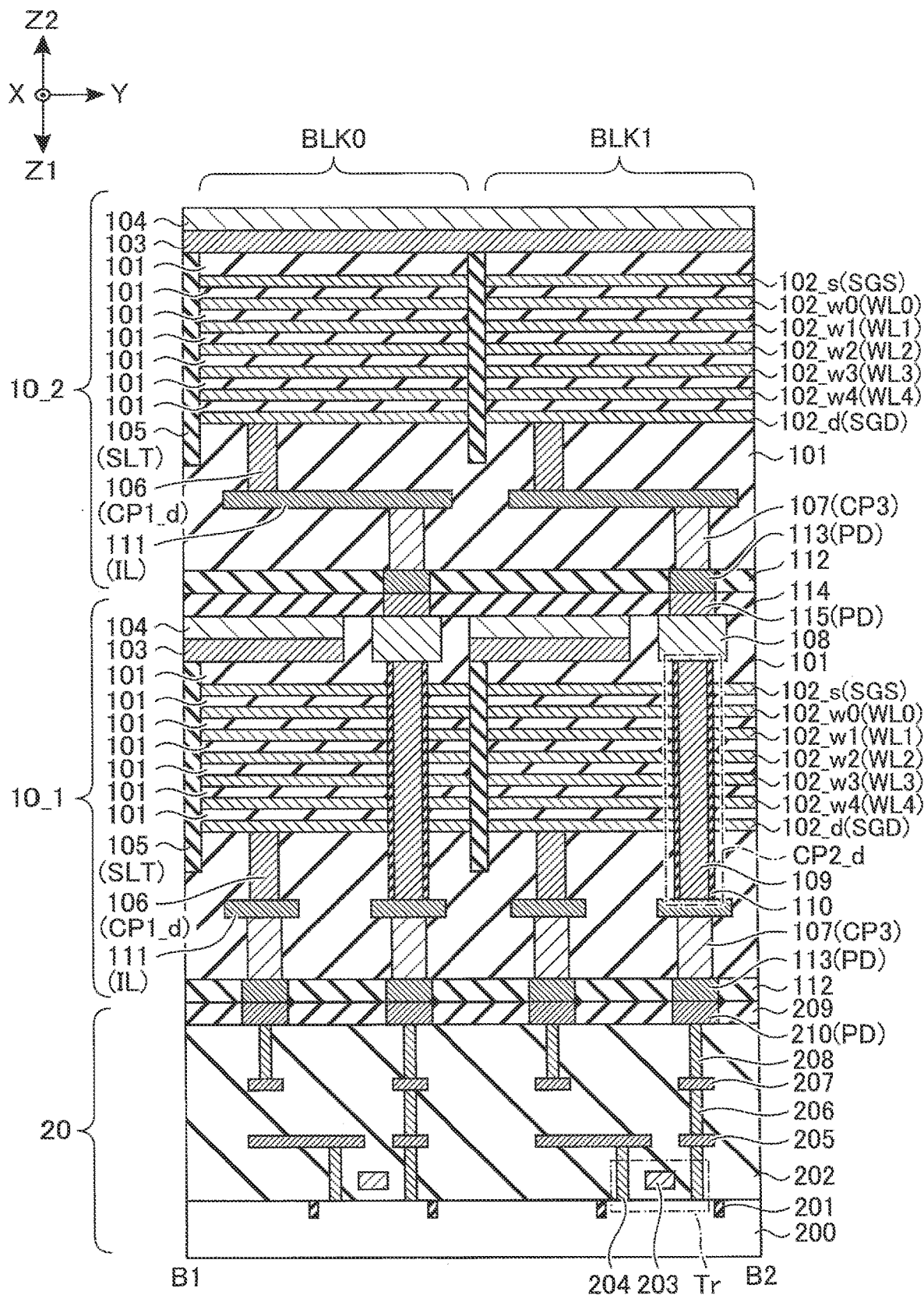
FIG. 9 is a sectional view taken along a line B1-B2 in FIGS. 6 and 7.

An example of the configuration of a section B1-B2 of the semiconductor memory device 1 will be described next with reference to FIG. 9. FIG. 9 is a sectional view taken along a line B1-B2 in FIGS. 6 and 7. The following description will be made with focus on differences from FIG. 8.

The internal configuration of the array chip 10_1 will be described. The example of FIG. 9 shows the section of the terrace of the select gate line SGD. Hence, seven interconnect layers 102 functioning as the select gate line SGS, the word lines WL0 to WL4, and the select gate line SGD are stacked in this order, in the Z1 direction. The contact plug CP1_d is provided on the interconnect layer 102_d functioning as the select gate line SGD.

The contact plugs CP1 coupled to the interconnect layers 102 functioning as the select gate lines SGD and SGS are not electrically coupled to the contact plugs CP2. In the example shown in FIG. 9, the contact plug CP1_d is not electrically coupled to the contact plug CP2_d adjacent in the Y direction. The contact plug CP1_d and the contact plug CP2_d are coupled to different interconnect layers 111. The interconnect layers 111 are coupled to different contact plugs CP3. Similarly, the contact plug CP1_s is not electrically coupled to the contact plug CP2_s adjacent in the Y direction.

1.6.3 Configuration of Section C1-C2

Figure 10:
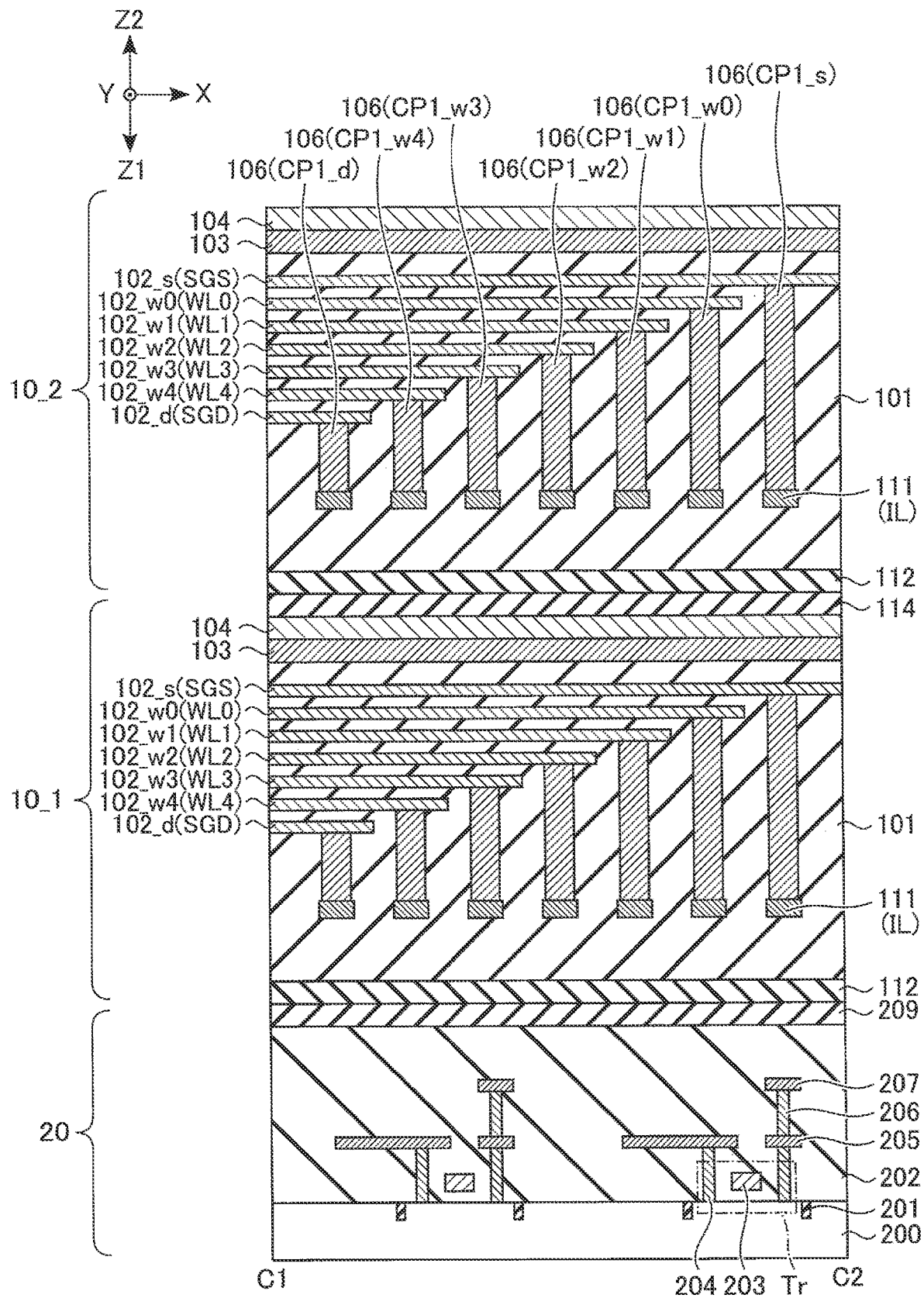
FIG. 10 is a sectional view taken along a line C1-C2 in FIGS. 6 and 7.

An example of the configuration of a section C1-C2 of the semiconductor memory device 1 will be described next with reference to FIG. 10. FIG. 10 is a sectional view taken along a line C1-C2 in FIGS. 6 and 7. The following description will be made with focus on the contact plugs CP1.

As shown in FIG. 10, in the plug coupling portions of the array chips 10_1 and 10_2, the plurality of interconnect layers 102 are extracted in a staircase shape along the X direction. The contact plug CP1 is provided on each of the surfaces of the terraces of the interconnect layers 102 facing the Z1 direction. In the example shown in FIG. 10, the contact plug CP1_s is provided on the terrace of the interconnect layer 102_s. The contact plug CP1_w0 is provided on the terrace of the interconnect layer 102_w0. The contact plug CP1_w1 is provided on the terrace of the interconnect layer 102_w1. The contact plug CP1_w2 is provided on the terrace of the interconnect layer 102_w2. The contact plug CP1_w3 is provided on the terrace of the interconnect layer 102_w3. The contact plug CP1_w4 is provided on the terrace of the interconnect layer 102_w4. The contact plug CP1_d is provided on the terrace of the interconnect layer 102_d. The lengths of the contact plugs CP1_s, CP1_w0 to CP1_w4, and CP1_d in the Z direction are different. The interconnect layer 111 is provided on each of the contact plugs CP1_s, CP1_w0 to CP1_w4, and CP1_d.

1.6.4 Configuration of Section D1-D2

Figure 11:
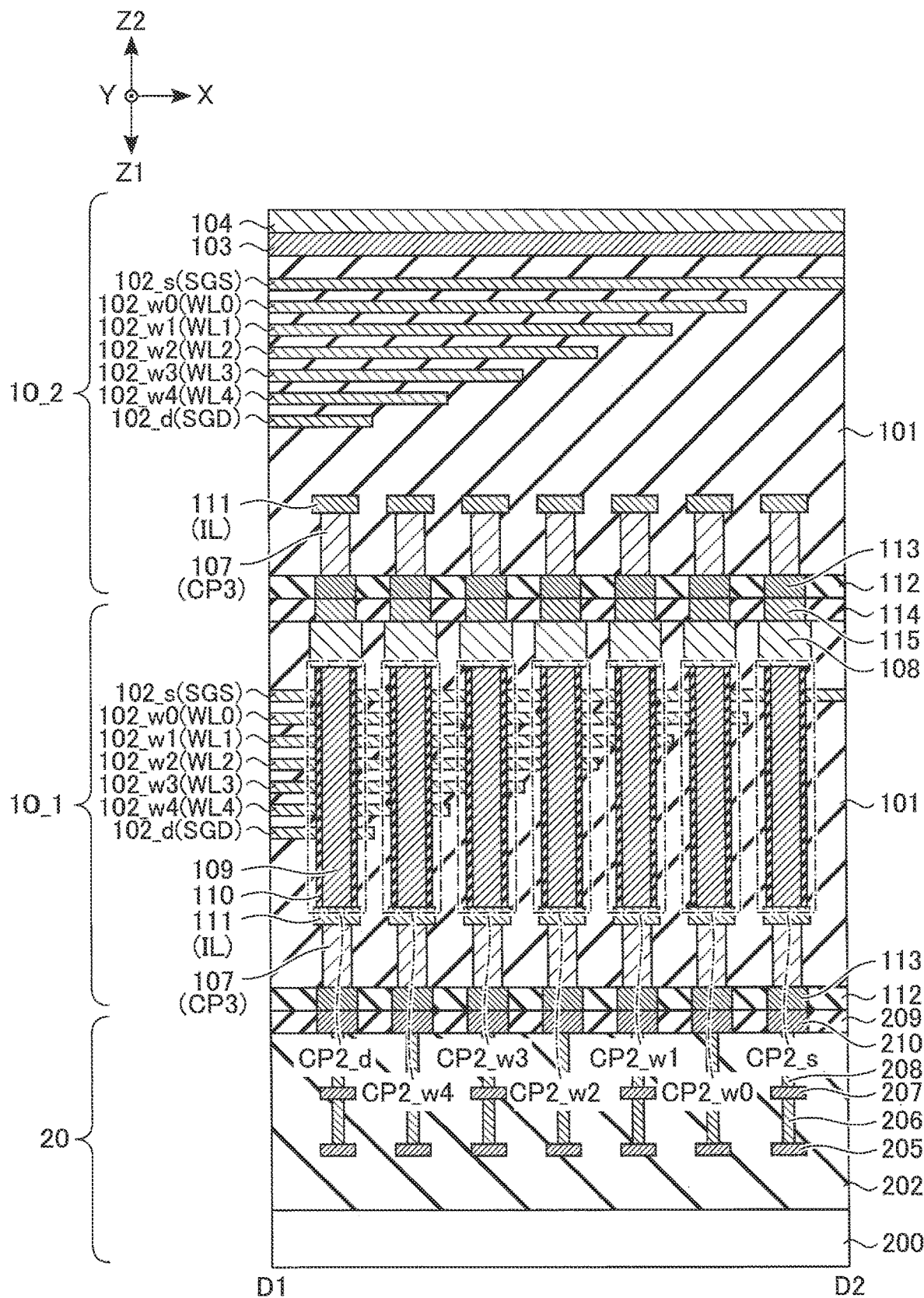
FIG. 11 is a sectional view taken along a line D1-D2 in FIGS. 6 and 7.

An example of the configuration of a section D1-D2 of the semiconductor memory device 1 will be described next with reference to FIG. 11. FIG. 11 is a sectional view taken along a line D1-D2 in FIGS. 6 and 7. The following description will be made with focus on the contact plugs CP2.

As shown in FIG. 11, in the plug coupling portion of the array chip 10_1, the contact plugs CP2_s, CP2_w0 to CP2_w4, and CP2_d are provided. In the example shown in FIG. 11, the contact plugs CP2_s, CP2_w0 to CP2_w4, and CP2_d are arranged in this order from the right side of the drawing sheet of FIG. 11 to the left side. The contact plugs CP2_s, CP2_w0 to CP2_w4, and CP2_d have almost the same shape (same length). The contact plugs CP2_s, CP2_w0 to CP2_w4, and CP2_d are not electrically coupled to the seven interconnect layers 102_s, 102_w0 to 102_w4, and 102_d. For example, the contact plug CP2_s extends through the interconnect layer 102_s. The contact plug CP2_w0 extends through the interconnect layers 102_s and 102_w0. The contact plug CP2_w1 extends through the interconnect layers 102_s, 102_w0, and 102_w1. The contact plug CP2_w2 extends through the interconnect layers 102_s and 102_w0 to 102_w2. The contact plug CP2_w3 extends through the interconnect layers 102_s and 102_w0 to 102_w3. The contact plug CP2_w4 extends through the interconnect layers 102_s and 102_w0 to 102_w4. The contact plug CP2_d extends through the interconnect layers 102_s, 102_w0 to 102_w4, and 102_d. One-end sides of the contact plugs CP2_s, CP2_w0 to CP2_w4, and CP2_d are coupled to different conductors 108. The other-end sides of the contact plugs CP2_s, CP2_w0 to CP2_w4, and CP2_d are coupled to different interconnect layers 111.

1.6.5 Configuration of Section E1-E2

Figure 12:
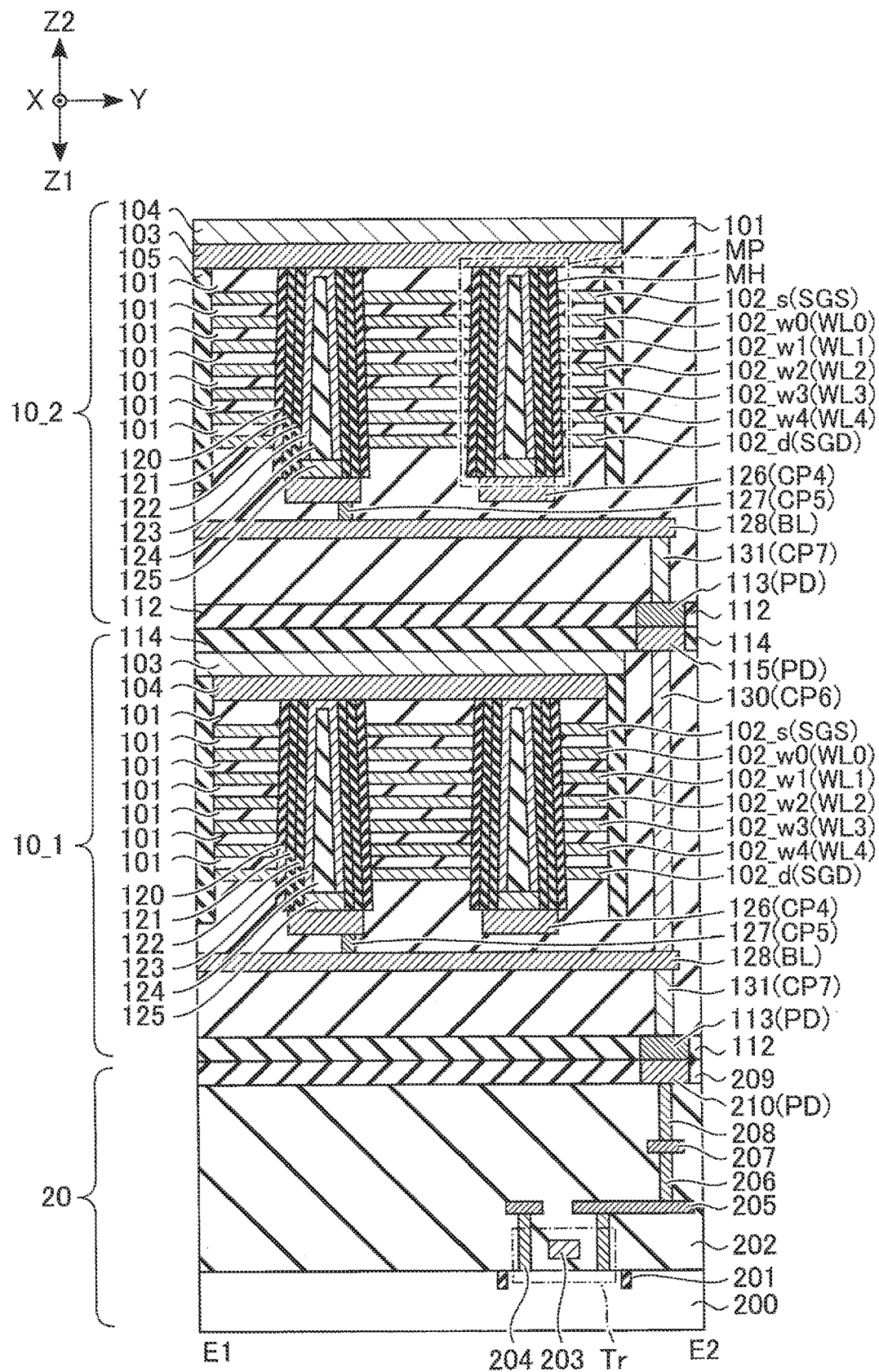
FIG. 12 is a sectional view taken along a line E1-E2 in FIGS. 6 and 7.

An example of the configuration of a section E1-E2 of the semiconductor memory device 1 will be described next with reference to FIG. 12. FIG. 12 is a sectional view taken along a line E1-E2 in FIGS. 6 and 7. The following description will be made with focus on the memory pillars MP and the bit lines BL.

As shown in FIG. 12, in the cell portions of the array chips 10_1 and 10_2, the plurality of memory pillars MP are provided.

Each memory pillar MP extends through the plurality of interconnect layers 102. The memory pillar MP extends in the Z direction. One end of the memory pillar MP is in contact with the interconnect layer 103. In the Z1 direction, a conductor 126 is provided on the other end of the memory pillar MP. The conductor 126 functions as a contact plug CP4. A conductor 127 is provided on the conductor 126. The conductor 127 functions as a contact plug CP5. In the Z1 direction, a plurality of interconnect layers 128 are provided above the memory pillars MP. The plurality of interconnect layers 128 are arranged in the X direction. The interconnect layers 128 extend in the Y direction. The interconnect layers 128 function as the bit lines BL. Each interconnect layer 128 is coupled to one of the memory pillars MP via the contact plugs CP4 and CP5.

In the array chip 10_1, one end of the interconnect layer 128 is coupled to the conductor 115 via a conductor 130. Also, the one end of the interconnect layer 128 is coupled to the conductor 113 via a conductor 131. The conductors 130 and 131 extend in the Y direction. The conductors 130 and 131 function as contact plugs CP6 and CP7, respectively.

In the array chip 10_2, one end of the interconnect layer 128 is coupled to the conductor 113 via the conductor 131. Hence, the interconnect layer 128 of the memory cell array 11_2 and the interconnect layer 128 of the memory cell array 11_1 arranged above in the Z1 direction are electrically coupled. In other words, the memory pillar MP of the memory cell array 11_2 and the memory pillar MP of the memory cell array 11_1 arranged above in the Z1 direction are electrically coupled to one bit line BL.

For the conductors 126, 127, 130, and 131 and the interconnect layer 128, for example, a metal material such as W, Al, or Cu is used.

The internal configuration of the memory pillar MP will be described next.

The memory pillar MP includes a block insulating film 120, a charge storage layer 121, a tunnel insulating film 122, a semiconductor layer 123, a core layer 124, and a cap layer 125.

More specifically, a hole MH extending through the plurality of interconnect layers 102 is provided. The hole MH corresponds to the memory pillar MP. An end portion of the hole MH in the Z2 direction reaches the interconnect layer 103. On the side surface of the hole MH, the block insulating film 120, the charge storage layer 121, and the tunnel insulating film 122 are stacked sequentially from the outer side. For example, if the hole MH has a cylindrical shape, the block insulating film 120, the charge storage layer 121, and the tunnel insulating film 122 each have a cylindrical shape. The semiconductor layer 123 is provided in contact with the side surface of the tunnel insulating film 122. An end portion of the semiconductor layer 123 in the Z2 direction is in contact with the interconnect layer 103. The semiconductor layer 123 is a region where the channels of the memory cell transistors MC and the select transistors ST1 and ST2 are formed. Hence, the semiconductor layer 123 functions as a signal line that couples the current paths of the select transistor ST2, the memory cell transistors MC0 to MC4, and the select transistor ST1. The inside of the semiconductor layer 123 is filled with the core layer 124. The cap layer 125 whose side surface is in contact with the tunnel insulating film 122 is provided on the end portions of the semiconductor layer 123 and the core layer 124 in the Z1 direction. That is, the memory pillar MP includes the semiconductor layer 123 that extends through the plurality of interconnect layers 102 and extends in the Z direction. Note that the cap layer 125 may be eliminated.

For the block insulating film 120, the tunnel insulating film 122, and the core layer 124, for example, SiO is used. For the charge storage layer 121, for example, silicon nitride (SiN) is used. For the semiconductor layer 123 and the cap layer 125, for example, polysilicon is used.

The memory pillar MP and the interconnect layers 102_w0 to 102_w4 are combined, thereby forming the memory cell transistors MC0 to MC4. Similarly, the memory pillar MP and the interconnect layer 102_d are combined, thereby forming the select transistor ST1. The memory pillar MP and the interconnect layer 102_s are combined, thereby forming the select transistor ST2.

Figure 13:
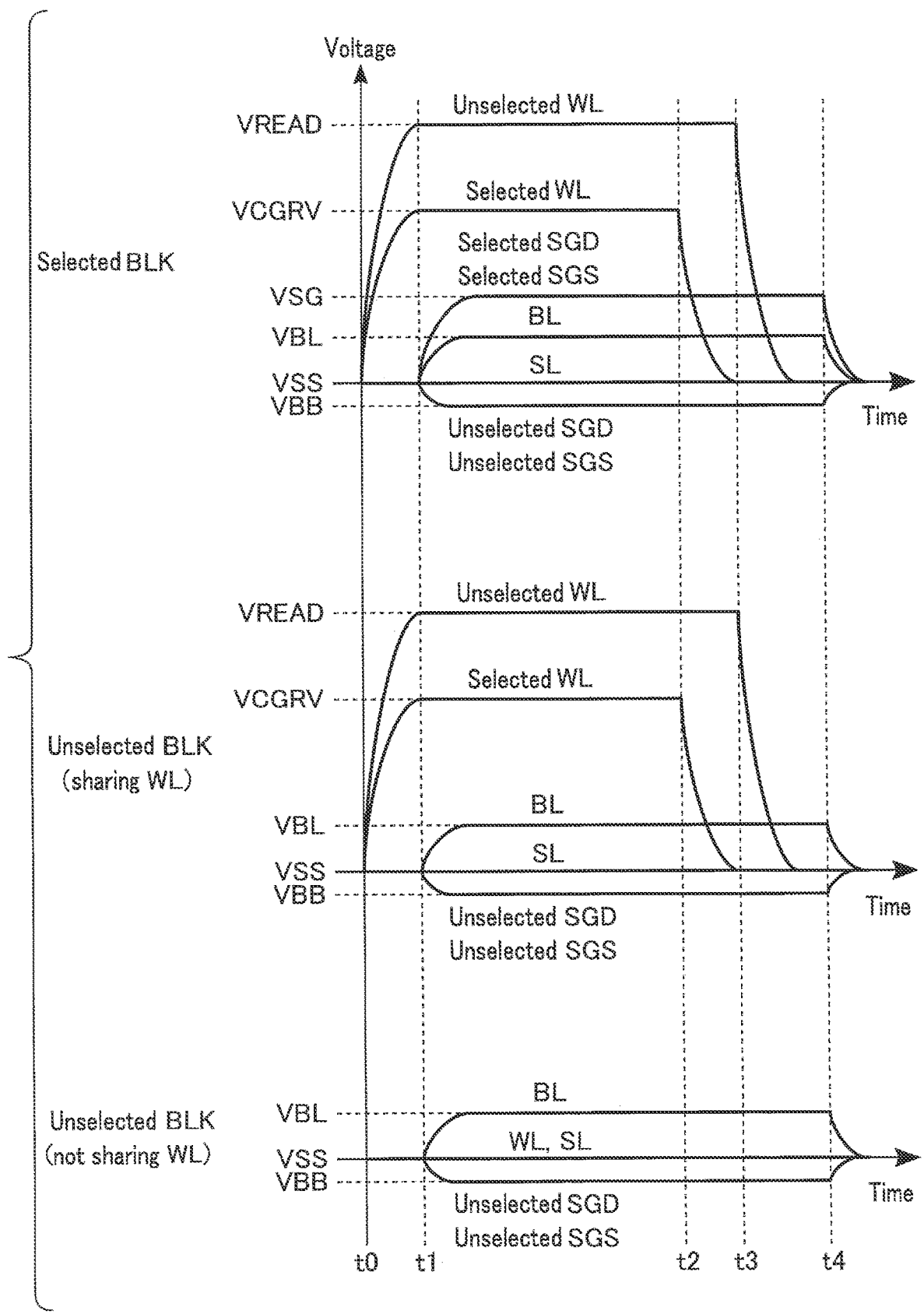
FIG. 13 is a timing chart showing the voltage of each interconnect in the read operation of the semiconductor memory device according to the first embodiment.

1.7 Read Operation
1.7.1 Voltage of Each Interconnect in Read Operation An example of the voltage of each interconnect in the read operation will be described next with reference to FIG. 13. FIG. 13 is a timing chart showing the voltage of each interconnect in the read operation. In the following description, a block BLK selected as the target of the read operation will be referred to as a "selected block BLK". An unselected block BLK that shares the word lines WL with the selected block BLK will be referred to as an "unselected block BLK (sharing WL)". The selected block BLK and the unselected block BLK (sharing WL) are stacked in the Z direction. In addition, an unselected block BLK that does not share the word lines WL with the selected block BLK will be referred to as an "unselected block BLK (not sharing WL)". For example, if the block BLK0_1 of the memory cell array 11_1 is selected, the block BLK0_2 of the memory cell array 11_2 is the unselected block BLK (sharing WL), and the remaining blocks BLK are the unselected blocks BLK (not sharing WL).

As shown in FIG. 13, first, at time t0, the row decoder 24 applies a read voltage VCGRV to the selected word line WL (to be referred to as the "selected word line WL" hereinafter) of the selected block BLK and the unselected block BLK (sharing WL) that shares the word line WL with the selected block BLK. The voltage VCGRV is a voltage set based on read data. If the threshold voltage of the memory cell transistor MC is equal to or higher than the voltage VCGRV, the memory cell transistor MC is set in an OFF state. If the threshold voltage of the memory cell transistor MC is lower than the voltage VCGRV, the memory cell transistor MC is set in an ON state.

The row decoder 24 applies a voltage VREAD to each unselected word line WL (to be referred to as an "unselected word line WL" hereinafter) of the selected block BLK and the unselected block BLK (sharing WL). The voltage VREAD is a voltage that sets the memory cell transistor MC in the ON state independently of the threshold voltage of the memory cell transistor MC. The voltage VREAD is a voltage higher than the voltage VCGRV.

The row decoder 24 applies a ground voltage VSS to the word lines WL of the unselected blocks BLK (not sharing WL).

At time t1, the row decoder 24 applies a voltage VSG to the select gate line SGD (selected SGD) and the select gate line SGS (selected SGS) corresponding to a selected string unit SU (to be referred to as a "selected string unit SU" hereinafter) of the selected block BLK. The voltage VSG is a voltage that sets the select transistors ST1 and ST2 in the ON state. In addition, the row decoder 24 applies a negative voltage VBB to the select gate line SGD (unselected SGD) and the select gate line SGS (unselected SGS) corresponding to each unselected string unit SU (to be referred to as an "unselected string unit SU" hereinafter) of the selected block BLK. The negative voltage VBB is a voltage that sets the select transistors ST1 and ST2 in the OFF state. The negative voltage VBB is a voltage lower than the voltage VSS. For example, if the string unit SU0 of the block BLK0_1 of the memory cell array 11_1 is selected, the voltage VSG is applied to the select gate lines SGD0_1 and SGS0_1 corresponding to the string unit SU0 of the block BLK0_1, and the negative voltage VBB is applied to the select gate lines SGD and SGS (for example, select gate lines SGD1_1 to SGD3_1 and SGS1_1 to SGS3_1) corresponding to the remaining string units SU (for example, the string units SU1, SU2, and SU3) of the block BLK0_1.

The row decoder 24 applies the negative voltage VBB to the select gate line SGD (unselected SGD) and the select gate line SGS (unselected SGS) corresponding to each unselected string unit SU of the unselected block BLK (sharing WL) and the unselected blocks BLK (not sharing WL).

The sense amplifier 25 applies a voltage VBL to the bit line BL. The voltage VBL is a voltage applied to the bit line BL in the read operation. The voltage VBL is a voltage lower than the voltage VSG. In addition, the voltage VSS is applied to the source line SL.

During the period of time t1 to t2, the sense amplifier 25 reads out the data of the memory cell transistors MC.

At time t2, the row decoder 24 applies the voltage VSS to the selected word line WL of the selected block BLK and the unselected block BLK (sharing WL).

At time t3, the row decoder 24 applies the voltage VSS to the unselected word lines WL of the selected block BLK and the unselected block BLK (sharing WL).

At time t4, the row decoder 24 applies the voltage VSS to the select gate lines SGD and SGS. The sense amplifier 25 applies the voltage VSS to the bit line BL. Thus, the sequencer 21 ends the read operation.

Figure 14:
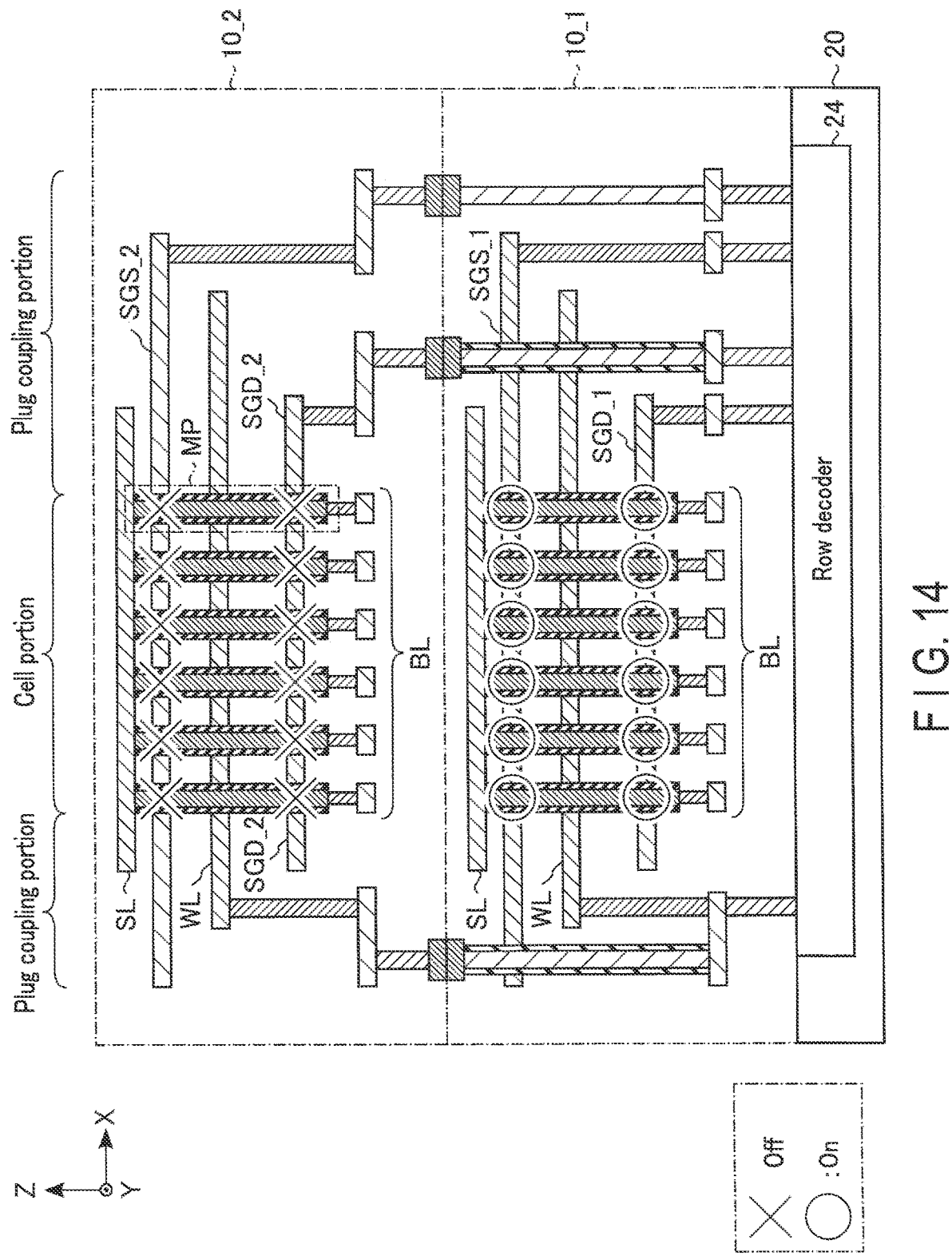
FIG. 14 is a sectional view of the memory cell arrays 11_1 and 11_2 and the circuit chip 20 showing an example of the states of select transistors ST1 and ST2 in the read operation of the semiconductor memory device according to the first embodiment.

1.7.2 Specific Example of Operations of Select Transistors ST1 and ST2 in Read Operation A specific example of the operations of the select transistors ST1 and ST2 in the read operation will be described next with reference to FIG. 14. FIG. 14 is a sectional view of the memory cell arrays 11_1 and 11_2 and the circuit chip 20 showing an example of the states of the select transistors ST1 and ST2 in the read operation. FIG. 14 shows a state in which the block BLK_1 of the memory cell array 11_1 is selected, and the block BLK_2 of the memory cell array 11_2 is not selected in the read operation. Note that FIG. 14 shows one word line WL in one memory cell array 11 to simplify the explanation.

As shown in FIG. 14, in the selected string unit SU of the memory cell array 11_1, the select transistor ST1 provided at a position where the select gate line SGD_1 (selected SGD) and each memory pillar MP cross is set in the ON state. Similarly, the select transistor ST2 provided at a position where the select gate line SGS_1 (selected SGS) and each memory pillar MP cross is set in the ON state. On the other hand, in the unselected string unit SU of the memory cell array 11_2, which shares the word line WL with the selected string unit SU of the memory cell array 11_1, the select transistor ST1 provided at a position where the select gate line SGD_2 (unselected SGD) and each memory pillar MP cross is set in the OFF state. Similarly, the select transistor ST2 provided at a position where the select gate line SGS_2 (unselected SGS) and each memory pillar MP cross is set in the OFF state. In the unselected string unit SU of the memory cell array 11_2, since the select transistors ST1 and ST2 are in the OFF state, the memory pillars MP (semiconductor layers 123) are in a floating state.

In this state, the row decoder 24 charges or discharges the word line WL. In the unselected memory cell array 11_2, since the memory pillars MP are in the floating state, the interconnection coupling capacitance between the word line WL and the memory pillars MP is suppressed. For this reason, the charge/discharge time of the word line WL is shortened as compared to a case where the memory pillars MP are not in the floating state.

Note that in the write operation as well, the select transistors ST1 and ST2 of the unselected string unit SU that shares the word line WL are set in the OFF state, thereby suppressing an increase in the charge/discharge time of the word line WL.

1.7 Effect of This Embodiment

With the configuration according to this embodiment, it is possible to provide a semiconductor memory device capable of suppressing an increase in the chip area. This effect will be described in detail.

For example, there is known a method of stacking a plurality of array chips to increase the degree of integration of a semiconductor memory device. If the word lines WL of each array chip are independently coupled to a circuit chip, the number of word lines WL coupled to a row decoder increases. Hence, the circuit scale of the row decoder becomes large in accordance with the number of array chips. In other words, the area of the circuit chip increases.

On the other hand, in the configuration according to this embodiment, the plurality of array chips can share the word lines WL. Hence, even if the number of array chips, that is, the number of stacked layers of word lines WL increases, an increase in the number of word lines WL coupled to the row decoder can be suppressed. This can suppress an increase in the area of the circuit chip.

Furthermore, in the configuration according to this embodiment, the bit lines BL can commonly be coupled in the plurality of array chips. Hence, even if the number of array chips increases, an increase in the number of bit lines BL coupled to the sense amplifier can be suppressed. This can suppress an increase in the area of the circuit chip.

Also, in the configuration according to this embodiment, the select gate lines SGD and SGS can independently be controlled in the plurality of array chips. Hence, the different string units SU of the plurality of array chips can independently be controlled.

Additionally, in the configuration according to this embodiment, since the select gate lines SGD and SGS can independently be controlled, the select transistors ST1 and ST2 can be set in the OFF state in each unselected string unit SU that shares the word lines WL. That is, in the read operation or the write operation, the memory pillars MP of the unselected string unit SU can be set in the floating state. In the unselected string unit SU, the interconnection coupling capacitance between the word lines WL and the memory pillars MP can thus be reduced. Hence, an increase in the charge/discharge time of the word lines WL can be suppressed.

2. Second Embodiment

The second embodiment will be described next. In the second embodiment, the structure of a memory cell array 11 different from the first embodiment will be described. Differences from the first embodiment will mainly be described below.

2.1 Circuit Configuration of Memory Cell Array

An example of the circuit configuration of memory cell arrays 11_1 and 11_2 will be described first with reference to FIG. 15.

Figure 15:
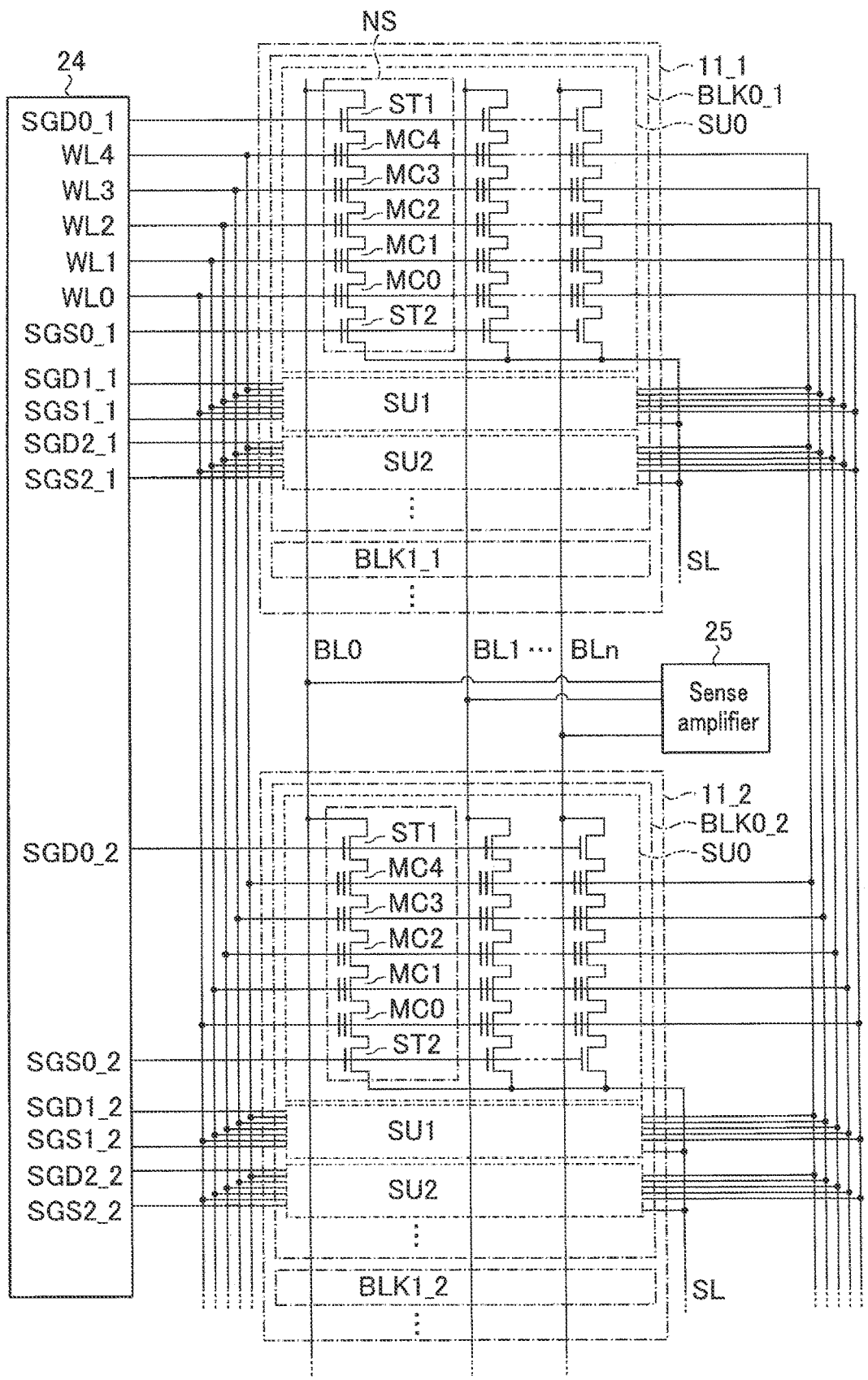
FIG. 15 is a circuit diagram of memory cell arrays 11_1 and 11_2 included in a semiconductor memory device according to the second embodiment.

As shown in FIG. 15, one-end sides of word lines WL0 to WL4 of the memory cell arrays 11_1 and 11_2 are commonly coupled to a row decoder 24. The other-end sides of the word lines WL0 to WL4 of the memory cell array 11_1 are coupled to the other-end sides of the word lines WL0 to WL4 of the memory cell array 11_2, respectively. The rest of the configuration is the same as in FIG. 2 of the first embodiment.

2.2 Coupling of Various Kinds of Interconnects Between Chips

An example of coupling of various kinds of interconnects between the chips will be described next with reference to FIG. 16. FIG. 16 is a sectional view showing the arrangement of the memory cell arrays 11_1 and 11_2 and a circuit chip 20. FIG. 16 shows one word line WL in one memory cell array 11 to simplify the explanation.

As shown in FIG. 16, in the plug coupling portion on the left side of the drawing sheet of FIG. 16, one-end sides of word lines WL of the memory cell arrays 11_1 and 11_2 are commonly coupled to the row decoder 24 of the circuit chip 20. In the plug coupling portion on the right side of the drawing sheet of FIG. 16, the other-end sides of the word lines WL of the memory cell arrays 11_1 and 11_2 are coupled to each other. The rest of the configuration is the same as in FIG. 4 of the first embodiment.

2.3 Configuration of Plug Coupling Portions

An example of the configuration of the plug coupling portions will be described next with reference to FIG. 17. FIG. 17 is a perspective view showing the configuration of the plug coupling portions of array chips 10_1 and 10_2. In FIG. 17, the cell portion is not illustrated to simplify the explanation. Also, FIG. 17 shows one word line WL in one memory cell array 11 to simplify the explanation.

As shown in FIG. 17, the configuration of the plug coupling portion on the right side of the drawing sheet of FIG. 17 is the same as in FIG. 5 of the first embodiment.

In the plug coupling portion of the memory cell array 11_2 on the left side of the drawing sheet of FIG. 17, a contact plug CP1_2 is provided on the terrace of the word line WL. A interconnect layer IL_2 is provided on the contact plug CP1_2. A contact plug CP3_2 is provided on the interconnect layer IL_2. An electrode pad PD is provided on the contact plug CP3_2.

On the bonding surface between the array chip 10_1 and the array chip 10_2, the electrode pads PD of the array chip 10_1 are provided at positions facing the electrode pads PD of the array chip 10_2. A contact plug CP2 is provided on the electrode pad PD. The contact plug CP2 extend (pass) through the word line WL and a select gate line SGS_1 of the memory cell array 11_1. In the plug coupling portion of the memory cell array 11_1 on the left side of the drawing sheet of FIG. 17, a contact plug CP1_1 is provided on the terrace of the word line WL. A interconnect layer IL_1 is provided on the contact plugs CP1_1 and CP2. More specifically, the contact plug CP1_1 coupled to the word line WL of the memory cell array 11_1 and the contact plug CP2 electrically coupled to the word line WL of the memory cell array 11_2 are commonly coupled to one interconnect layer IL_1. In the plug coupling portion on the left side of the drawing sheet of FIG. 17, a contact plug CP3_1 is not provided on the interconnect layer IL_1.

2.4 Planar Configurations of Memory Cell Arrays

Figure 18:
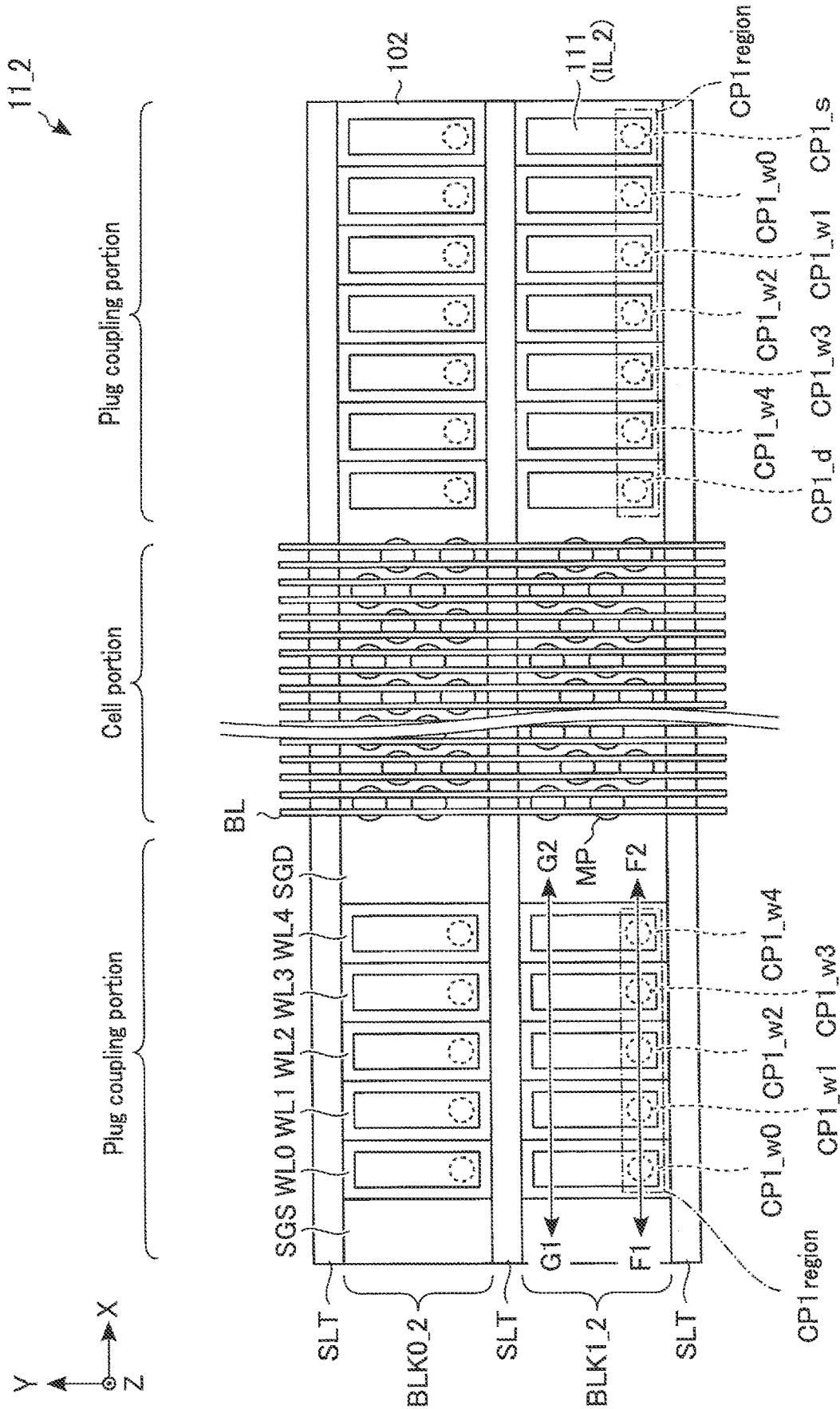
FIG. 18 is a plan view of the memory cell array 11_2 included in the semiconductor memory device according to the second embodiment.
Figure 19:
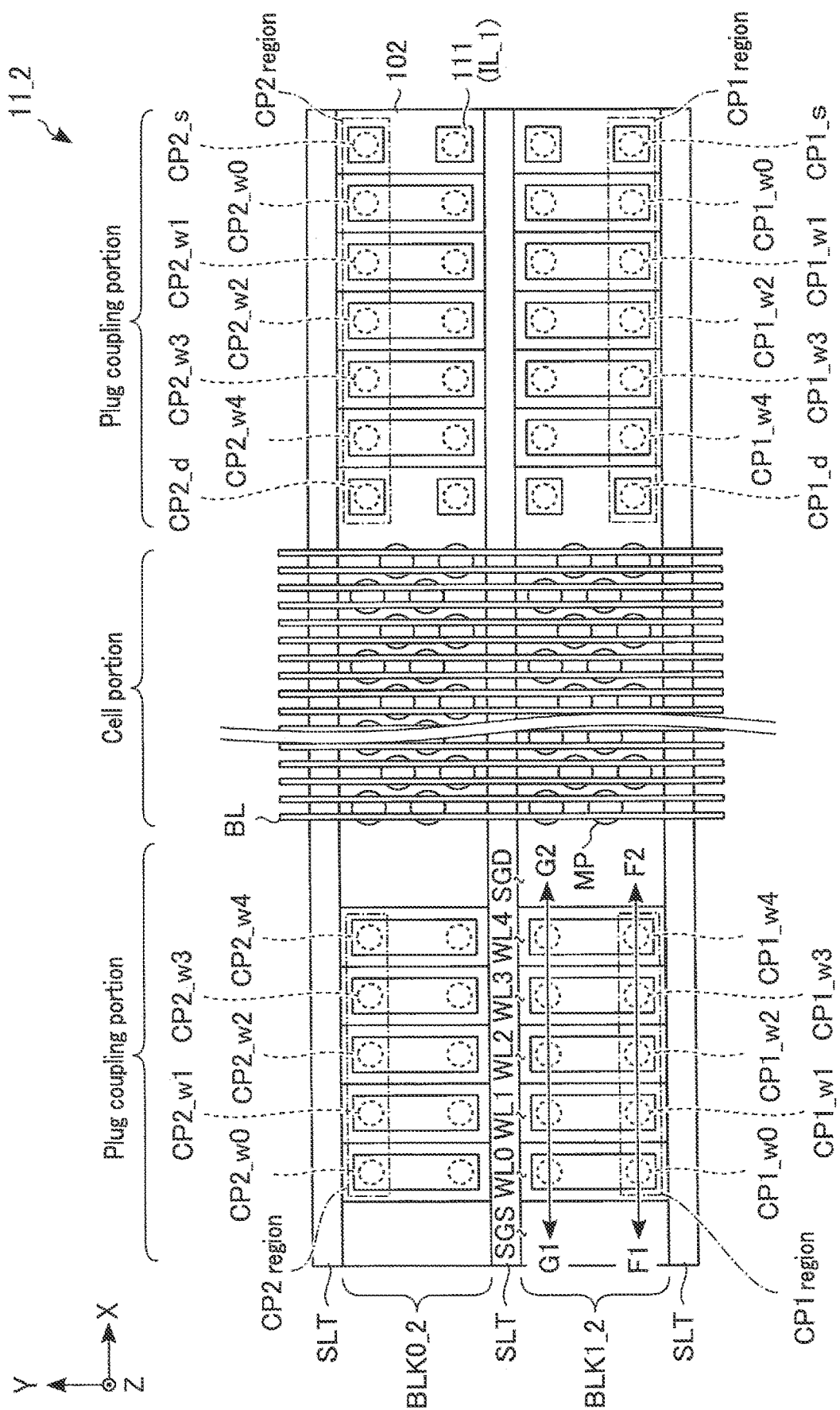
FIG. 19 is a plan view of the memory cell array 11_1 included in the semiconductor memory device according to the second embodiment.

An example of the planar configurations of the memory cell arrays 11 will be described next with reference to FIGS. 18 and 19. FIG. 18 is a plan view of the memory cell array 11_2. FIG. 19 is a plan view of the memory cell array 11_1. Note that in the example shown in FIGS. 18 and 19, to simplify the explanation, a case where each block BLK includes one string unit SU will be described. Also, in the example shown in FIGS. 18 and 19, insulating layers are not illustrated.

The planar configuration of the memory cell array 11_2 will be described first.

As shown in FIG. 18, the configuration of a CP1 region provided in the plug coupling portion on the right side of the drawing sheet of FIG. 18 is the same as in FIG. 6 of the first embodiment. Contact plugs CP1_s, CP1_w0, CP1_w1, CP1_w2, CP1_w3, CP1_w4, and CP1_d are arranged in a line from the end portion of the memory cell array 11_2 in the X direction to the cell portion. A interconnect layer 111 (IL_2) is provided on each contact plug CP1.

In this embodiment, the CP1 region is provided in the plug coupling portion on the left side of the drawing sheet of FIG. 18. More specifically, the contact plugs CP1_w0, CP1_w1, CP1_w2, CP1_w3, and CP1_w4 are provided on the word lines WL0 to WL4, respectively. The contact plugs CP1_w0, CP1_w1, CP1_w2, CP1_w3, and CP1_w4 are arranged in a line from the end portion of the memory cell array 11_2 in the X direction to the cell portion. The interconnect layer 111 (IL_2) is provided on each of the contact plugs CP1_w0, CP1_w1, CP1_w2, CP1_w3, and CP1_w4.

The configuration of the cell portion is the same as in FIG. 6 of the first embodiment.

The planar configuration of the memory cell array 11_1 will be described next. Differences from the planar configuration of the memory cell array 11_2 will mainly be described below.

As shown in FIG. 19, the configurations of the CP1 region and the CP2 region provided in the plug coupling portion on the right side of the drawing sheet of FIG. 19 are the same as in FIG. 6 of the first embodiment.

In this embodiment, the CP1 region and the CP2 region are provided in the plug coupling portion on the left side of the drawing sheet of FIG. 19. The configuration of the CP1 region in the plug coupling portion on the left side of the drawing sheet of FIG. 19 is the same as in the memory cell array 11_2 described with reference to FIG. 18.

The CP2 region in the plug coupling portion on the left side of the drawing sheet of FIG. 19 is provided with contact plugs CP2_w0, CP2_w1, CP2_w2, CP2_w3, and CP2_w4. The interconnect layers 111 (IL_1) are provided on the contact plugs CP1 and CP2. The contact plugs CP1_w0 to CP1_w4 are coupled to the contact plugs CP2_w0 to CP2_w4, respectively, via the interconnect layers 111. That is, in the plug coupling portion on the left side of the drawing sheet of FIG. 19, the word lines WL0 to WL4 of a block BLK0_1 of the memory cell array 11_1 are electrically coupled to the word lines WL0 to WL4 of a block BLK0_2 of the memory cell array 11_2, respectively.

2.5 Sectional Configuration of Semiconductor Memory Device

The sectional configuration of a semiconductor memory device 1 will be described next.

2.5.1 Configuration of Section F1-F2

Figure 20:
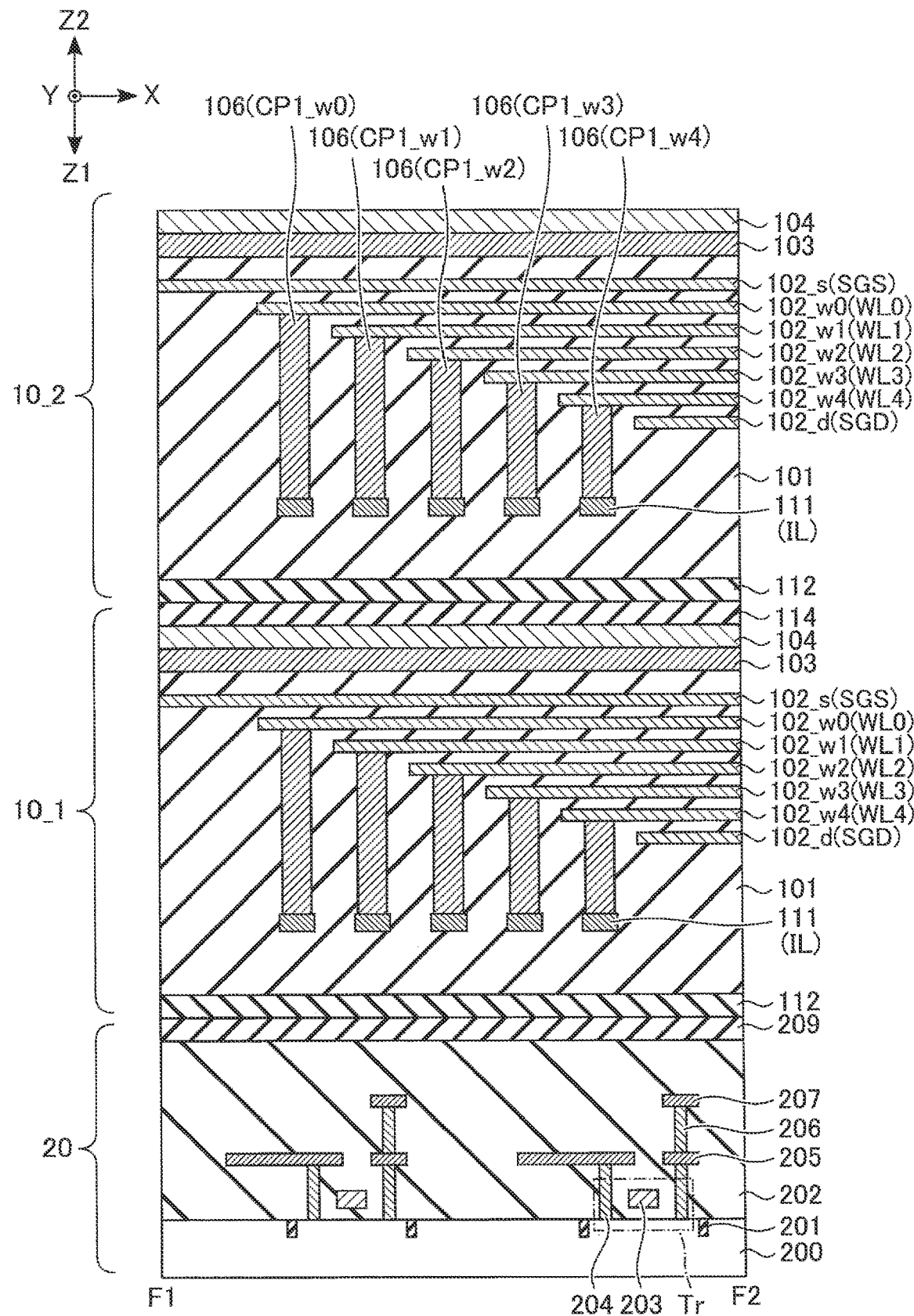
FIG. 20 is a sectional view taken along a line F1-F2 in FIGS. 18 and 19.

An example of the configuration of a section F1-F2 of the semiconductor memory device 1 will be described next with reference to FIG. 20. FIG. 20 is a sectional view taken along a line F1-F2 in FIGS. 18 and 19. The following description will be made with focus on the contact plugs CP1.

As shown in FIG. 20, the contact plug CP1_w0 is provided on the terrace of an interconnect layer 102_w0. The contact plug CP1_w1 is provided on the terrace of an interconnect layer 102_w1. The contact plug CP1_w2 is provided on the terrace of an interconnect layer 102_w2. The contact plug CP1_w3 is provided on the terrace of an interconnect layer 102_w3. The contact plug CP1_w4 is provided on the terrace of an interconnect layer 102_w4. The interconnect layer 111 is provided on each of the contact plugs CP1_w0 to CP1_w4.

2.5.2 Configuration of Section G1-G2

Figure 21:
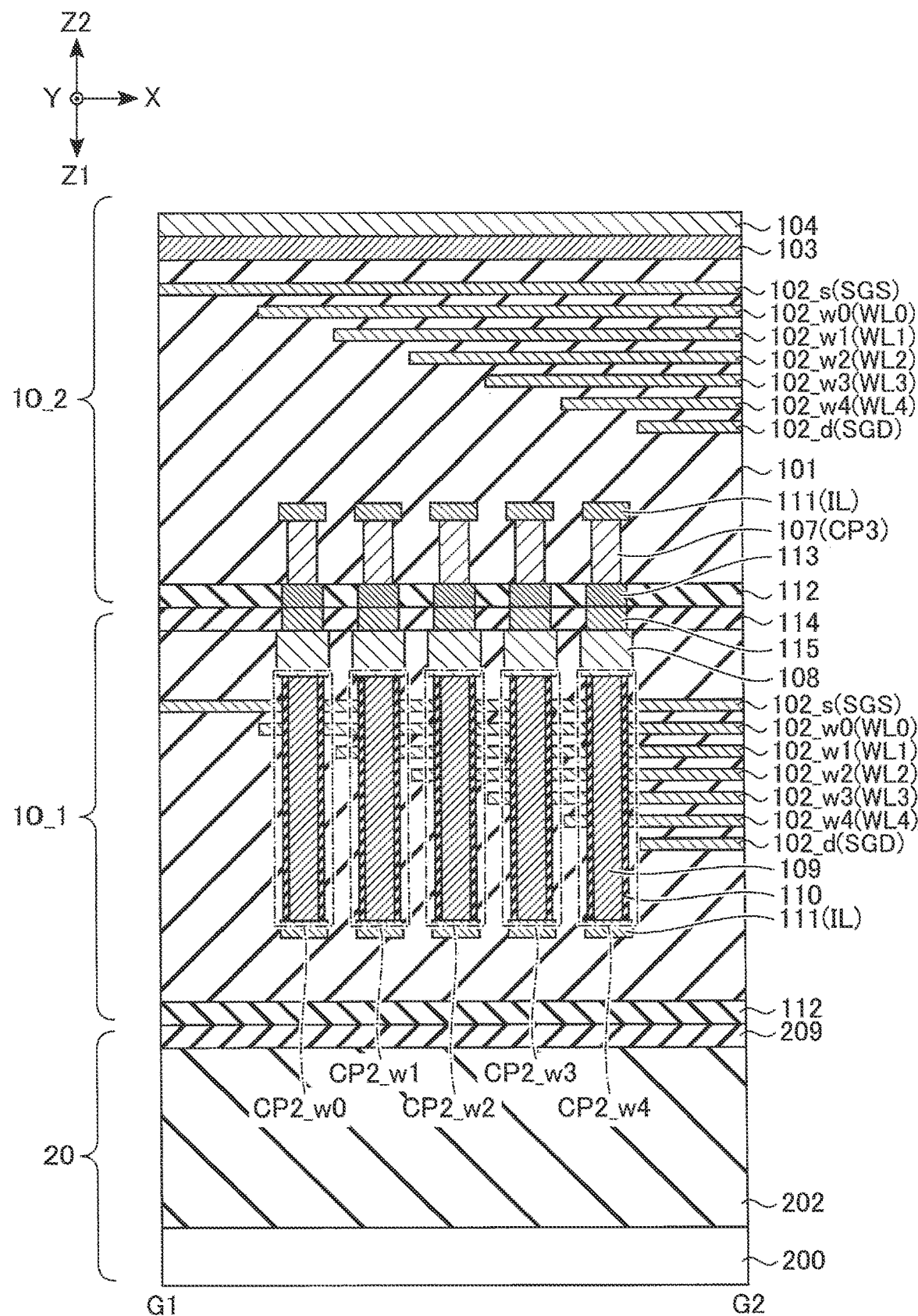
FIG. 21 is a sectional view taken along a line G1-G2 in FIGS. 18 and 19.

An example of the configuration of a section G1-G2 of the semiconductor memory device 1 will be described next with reference to FIG. 21. FIG. 21 is a sectional view taken along a line G1-G2 in FIGS. 18 and 19. The following description will be made with focus on the contact plugs CP2.

As shown in FIG. 21, the contact plugs CP2_w0 to CP2_w4 are provided in the plug coupling portion of the array chip 10_1. In the example shown in FIG. 21, the contact plugs CP2_w0 to CP2_w4 are arranged in this order from the left side of the drawing sheet of FIG. 21 to the right side. One end of each of the contact plugs CP2_w0 to CP2_w4 is coupled to a conductor 108. The other end of each of the contact plugs CP2_w0 to CP2_w4 is coupled to the interconnect layer 111. The contact plug CP3 is not provided on the interconnect layer 111.

Figure 22:
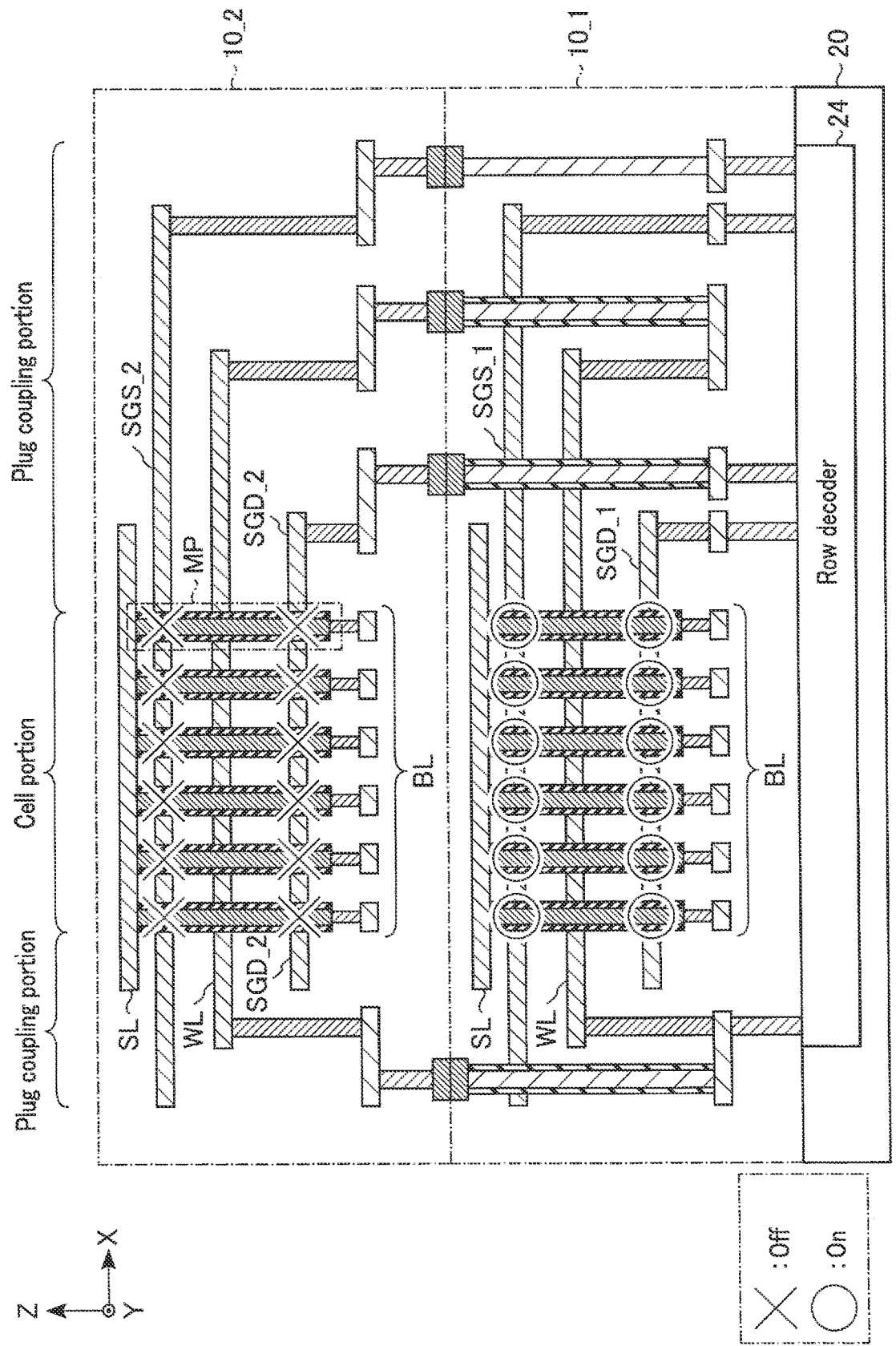
FIG. 22 is a sectional view of the memory cell arrays 11_1 and 11_2 and the circuit chip 20 showing an example of the states of select transistors ST1 and ST2 in the read operation of the semiconductor memory device according to the second embodiment.

2.6 Specific Example of Operations of Select Transistors ST1 and ST2 in Read Operation A specific example of the operations of the select transistors ST1 and ST2 in the read operation will be described next with reference to FIG. 22. FIG. 22 is a sectional view of the memory cell arrays 11_1 and 11_2 and the circuit chip 20 showing an example of the states of the select transistors ST1 and ST2 in the read operation. FIG. 22 shows a state in which a block BLK_1 of the memory cell array 11_1 is selected, and a block BLK_2 of the memory cell array 11_2 is not selected in the read operation. Note that FIG. 22 shows one word line WL in one memory cell array 11 to simplify the explanation.

As shown in FIG. 22, the select transistors ST1 and ST2 of the selected string unit SU of the memory cell array 11_1 are set in the ON state, as in FIG. 13 of the first embodiment. On the other hand, the select transistors ST1 and ST2 of the unselected string unit SU of the memory cell array 11_2 are set in the OFF state. In the unselected string unit SU of the memory cell array 11_2, since the select transistors ST1 and ST2 are in the OFF state, the memory pillars MP (semiconductor layers 123) are in a floating state.

In this state, the row decoder 24 charges or discharges the word line WL. In this embodiment, one-end sides of the word lines WL of the memory cell arrays 11_1 and 11_2 are commonly coupled to the row decoder 24. The other-end sides of the word lines WL of the memory cell arrays 11_1 and 11_2 are coupled to each other. Hence, the word line WL of the selected string unit SU is charged/discharged from the one-end side coupled to the row decoder 24 and the other-end side coupled to the unselected string unit SU. For this reason, the charge/discharge time of the word line WL is shortened as compared to a case where the other-end sides of the word lines WL are not coupled to each other.

Note that this also applies to a write operation.

2.7 Effect of This Embodiment

With the configuration according to this embodiment, it is possible to obtain the same effect as in the first embodiment.

Furthermore, in the configuration according to this embodiment, In the plurality of array chips, one-end sides of the word lines WL are commonly coupled to the row decoder 24, and the other-end sides are coupled to each other. Hence, when charging/discharging the word line WL, charging/discharging can be executed from the one-end side coupled to the row decoder 24 and the other-end side coupled to the unselected string unit SU. It is therefore possible to suppress an increase in the charge/discharge time of the word line WL.

3. Modifications

According to the above embodiment, the semiconductor memory device includes a first memory cell array (11_1), a second memory cell array (11_2) arranged above the first memory cell array in a first direction (Z direction), and a row decoder (24). The first memory cell array includes a first select transistor (ST1), a first memory cell (MC), a second select transistor (ST2), a first word line (WL) extending in a second direction (X direction) crossing the first direction and coupled to the first memory cell, a first select gate line (SGD_1) extending in the second direction and coupled to the first select transistor, and a second select gate line (SGS_1) extending in the second direction and coupled to the second select transistor. The first select transistor, the first memory cell, and the second select transistor are arranged along the first direction and coupled in series. The second memory cell array includes, a third select transistor (ST1), a second memory cell (MC), a fourth select transistor (ST2), a second word line (WL) extending in the second direction and coupled to the second memory cell, a third select gate line (SGD_2) extending in the second direction and coupled to the third select transistor, a fourth select gate line (SGS_2) extending in the second direction and coupled to the fourth select transistor. The third select transistor, the second memory cell, and the fourth select transistor are arranged along the first direction and coupled in series. The first word line and the second word line are commonly coupled to the row decoder. The first select gate line, the second select gate line, the third select gate line, and the fourth select gate line are separately coupled to the row decoder.

When the above-described embodiments are applied, it is possible to provide a semiconductor memory device capable of suppressing an increase in the chip area.

Note that the embodiments are not limited to the forms described above, and various modifications can be made.

For example, in the above-described embodiments, a case where the circuit chip 20 and the two array chips 10_1 and 10_2 are bonded has been described. However, these components may be formed on one semiconductor substrate.

For example, in the above-described embodiments, the plurality of interconnect layers 102 may not be extracted in a staircase shape in the plug coupling portion.

For example, in the second embodiment, one end and the other end of the word line WL may be coupled to the row decoder 24.

For example, in the above-described embodiments, the bit lines BL of the memory cell array 11_1 and the bit lines BL of the memory cell array 11_2 may separately be coupled to the sense amplifier 25. Alternatively, the bit lines BL of the memory cell array 11_1 and the bit lines BL of the memory cell array 11_2 may be coupled to the sense amplifier 25 via a selection circuit that selects one of the bit line BL of the memory cell array 11_1 and the bit line BL of the memory cell array 11_2.

Also, "couple" in the above-described embodiments can also include a state in which elements are indirectly coupled while interposing, for example, another element such as a transistor or a resistor between these.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a first memory cell array;
a second memory cell array arranged above the first memory cell array in a first direction; and
a row decoder,
wherein the first memory cell array includes:
 a first select transistor;
 a first memory cell;
 a second select transistor, the first select transistor, the first memory cell, and the second select transistor being arranged along the first direction and coupled in series;
 a first word line extending in a second direction crossing the first direction and coupled to the first memory cell;
 a first select gate line extending in the second direction and coupled to a gate of the first select transistor; and
 a second select gate line extending in the second direction and coupled to a gate of the second select transistor,
the second memory cell array includes:
 a third select transistor;
 a second memory cell;
 a fourth select transistor, the third select transistor, the second memory cell, and the fourth select transistor being arranged along the first direction and coupled in series;
 a second word line extending in the second direction and coupled to the second memory cell;
 a third select gate line extending in the second direction and coupled to a gate of the third select transistor; and
 a fourth select gate line extending in the second direction and coupled to a gate of the fourth select transistor,
the first word line and the second word line are commonly coupled to the row decoder,
the first select gate line, the second select gate line, the third select gate line, and the fourth select gate line are separately coupled to the row decoder,
the first memory cell array further includes:
 a first contact plug extending in the first direction and provided on the first word line; and
 a second contact plug passing through the first word line and the second select gate line and not electrically coupled to the first word line and the second select gate line,
the second memory cell array further includes
 a third contact plug extending in the first direction and provided on the second word line, and
the first word line is electrically coupled to the second word line via the first contact plug, the second contact plug, and the third contact plug.
2. The device according to claim 1, wherein
in a read operation of the first memory cell, the first select transistor and the second select transistor are set in an ON state, and the third select transistor and the fourth select transistor are set in an OFF state.
3. The device according to claim 1, wherein
the first memory cell array further includes a first bit line coupled to a drain of the first select transistor, and a first source line coupled to a source of the second select transistor, the second memory cell array further includes a second bit line coupled to a drain of the third select transistor, and a second source line coupled to a source of the fourth select transistor, the first bit line and the second bit line are electrically coupled, and the first source line and the second source line are electrically coupled.

4. The device according to claim 1, wherein
the first select gate line, the first word line, and the second select gate line are stacked apart in the first direction, and end portions of the first select gate line, the first word line, and the second select gate line are arranged in a staircase shape in the second direction.

5. The device according to claim 1, wherein
the first memory cell array further includes a memory pillar passing through the first word line, the first select gate line, and the second select gate line and extending in the first direction, the first memory cell is formed by a combination of the first word line and the memory pillar, the first select transistor is formed by a combination of the first select gate line and the memory pillar, and the second select transistor is formed by a combination of the second select gate line and the memory pillar.

6. The device according to claim 5, wherein
the memory pillar includes a semiconductor layer and a charge storage layer.

7. The device according to claim 1, wherein
in the first direction, the first memory cell array is arranged between the row decoder and the second memory cell array.

8. The device according to claim 3, further comprising a sense amplifier,
wherein the first bit line and the second bit line are commonly coupled to the sense amplifier.

9. The device according to claim 1, further comprising:
a first chip including the first memory cell array;
a second chip including the second memory cell array; and
a third chip including the row decoder,
wherein the second chip is bonded to a first surface of the first chip, and
the third chip is bonded to a second surface of the first chip facing the first surface.

10. The device according to claim 1, wherein
one end of the first word line and one end of the second word line are commonly coupled to the row decoder, and the other end of the first word line and the other end of the second word line are coupled to each other.

11. The device according to claim 10, wherein
in a read operation of the first memory cell, the first select transistor and the second select transistor are set in an ON state, and the third select transistor and the fourth select transistor are set in an OFF state.

* * * * *